US012597919B2

(12) United States Patent
Imamura et al.

(10) Patent No.: US 12,597,919 B2
(45) Date of Patent: Apr. 7, 2026

(54) DRIVING METHOD AND DRIVING DEVICE FOR SEMICONDUCTOR DEVICE, AND POWER CONVERSION APPARATUS

(71) Applicant: Mitsubishi Electric Corporation, Tokyo (JP)

(72) Inventors: Yasutaka Imamura, Tokyo (JP); Yohei Mitsui, Tokyo (JP); Yukihiko Wada, Tokyo (JP); Takayoshi Miki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 244 days.

(21) Appl. No.: 18/561,732

(22) PCT Filed: May 25, 2021

(86) PCT No.: PCT/JP2021/019856
§ 371 (c)(1),
(2) Date: Nov. 17, 2023

(87) PCT Pub. No.: WO2022/249297
PCT Pub. Date: Dec. 1, 2022

(65) Prior Publication Data
US 2024/0235542 A1     Jul. 11, 2024

(51) Int. Cl.
*H02M 1/08*      (2006.01)
*H03K 17/082*    (2006.01)
*H03K 17/16*     (2006.01)

(52) U.S. Cl.
CPC .......... *H03K 17/0822* (2013.01); *H02M 1/08* (2013.01); *H03K 17/165* (2013.01)

(58) Field of Classification Search
CPC .... H02M 1/08; H03K 17/0822; H03K 17/165
(Continued)

(56) References Cited

U.S. PATENT DOCUMENTS

2003/0180997 A1*   9/2003   Nakayama ....... H03K 17/08128
                                                          438/200
2016/0218612 A1*   7/2016   Morimoto ........... H02M 7/5387
(Continued)

FOREIGN PATENT DOCUMENTS

JP      2010-119184 A      5/2010
JP      2014-147237 A      8/2014
(Continued)

OTHER PUBLICATIONS

Office Action issued Feb. 4, 2025 in Japanese Patent Application No. 2023-523773, 12 pages.
(Continued)

*Primary Examiner* — William Hernandez
(74) *Attorney, Agent, or Firm* — XSENSUS LLP

(57)     ABSTRACT

A semiconductor device is subjected to ON/OFF control by controlling a gate voltage according to a drive control signal. In a turn-on operation for charging a gate in response to transition of drive control signal from a first level to a second level, a drive signal is set to first level to discharge the gate at a first time after end of a Miller period of a gate voltage, thereby providing a voltage drop period in which gate voltage temporarily drops. At a second time, drive signal is again set to second level to start charging the gate.

20 Claims, 19 Drawing Sheets

101

(58) Field of Classification Search
USPC ................................................. 327/108, 109
See application file for complete search history.

(56) References Cited

U.S. PATENT DOCUMENTS

| | | | | |
|---|---|---|---|---|
| 2016/0276956 A1* | 9/2016 | Suzuki | ................... | H03K 17/56 |
| 2017/0099046 A1 | 4/2017 | Osanai et al. | | |
| 2019/0229723 A1* | 7/2019 | Nakashima | ........ | H03K 17/0822 |
| 2019/0310675 A1* | 10/2019 | Araragi | ................... | H02M 1/08 |
| 2020/0052686 A1* | 2/2020 | Wada | ................... | H03K 17/284 |
| 2022/0302914 A1* | 9/2022 | Adachi | ............... | H03K 17/168 |
| 2022/0345128 A1* | 10/2022 | Nagatomi | ............ | H03K 17/163 |
| 2023/0261654 A1* | 8/2023 | Mitsui | ..................... | H02M 1/08 |
| | | | | 327/108 |
| 2025/0226823 A1* | 7/2025 | Adachi | ............... | H03K 17/127 |

FOREIGN PATENT DOCUMENTS

| | | | |
|---|---|---|---|
| JP | 2017-070164 A | 4/2017 | |
| WO | 2018/198426 A1 | 11/2018 | |

OTHER PUBLICATIONS

International Search Report and Written Opinion mailed on Jul. 20, 2021, received for PCT Application PCT/JP2021/019856, filed on May 25, 2021, 8 pages including English Translation.
Office Action issued Jan. 16, 2026 in Indian Patent Application No. 202327078328, 6 pages.

* cited by examiner

FIG.19

DRIVING METHOD AND DRIVING DEVICE FOR SEMICONDUCTOR DEVICE, AND POWER CONVERSION APPARATUS

CROSS-REFERENCE TO RELATED APPLICATION

This application is based on PCT filing PCT/JP2021/019856, filed May 25, 2021, the entire contents of which are incorporated herein by reference.

TECHNICAL FIELD

The present disclosure relates to a driving method and a driving device for a semiconductor device, and a power conversion apparatus.

BACKGROUND ART

A driving device for charging and discharging a gate of a semiconductor device according to an on/off control signal is applied for a switching operation of a voltage-driven semiconductor device represented by MOS-FET (metal-oxide-semiconductor field-effect transistor) and IGBT (insulated gate bipolar transistor).

In a steady switching operation of such a semiconductor device, it is required to increase a switching speed for the purpose of reducing a switching loss caused in the semiconductor device by turning on or turning off the semiconductor device.

Further, when an abnormality occurs in an electric circuit to which a semiconductor device is connected, an overcurrent path containing the semiconductor device may be formed due to turn-on of the semiconductor device. Even in such a case, it is required to turn on and off the semiconductor device so that damage to the semiconductor device caused by the influence of overcurrent is avoided.

Specifically, in order to prevent the semiconductor device from being broken down even when an overcurrent occurs, it needs a condition that the semiconductor device must be turned off before time until the semiconductor device has been broken down (so-called short circuit withstand time) has elapsed, or a surge voltage generated in a process of interrupting the overcurrent must be reduced to a withstand voltage capability of the semiconductor device or less. In order to satisfy this condition, it is desirable that a switching speed is low, contrary to the steady switching operation. As described above, with respect to the switching speed of the semiconductor device, there is a trade-off relationship between reduction of the switching loss under the steady state and reduction of a possibility of breakdown of the semiconductor device under an abnormal state.

Japanese Patent Laying-Open No. 2010-119184 (PTL 1) discloses a semiconductor driving device for enabling an active gate driving method even when a Miller period cannot be accurately detected, the active gate driving method being a method for restraining occurrence of surge current by gently performing turn-on until the Miller period, and reducing the switching loss by speeding up turn-on at the time point when the time has exceeded the Miller period. Specifically, a gate input signal is subjected to PWM (pulse width modulation) control in the Miller period at turn-on time or turn-off time, thereby reducing both the surge current and the switching loss CITATION LIST

PATENT LITERATURE

PTL 1: Japanese Patent Laying-Open No. 2010-119184

SUMMARY OF INVENTION

Technical Problem

The semiconductor driving device of PTL 1 is mainly directed to reduction of power loss and current surge in switching under a steady state, but PTL 1 does not mention any countermeasure to a case where an overcurrent path is formed according to turn-on of a semiconductor device. For this reason, there is a concern that the control of the gate voltage described in PTL 1 is less effective in reducing the possibility of damage to the semiconductor device under an abnormal state in which an overcurrent occurs.

Suffice it to say that in PTL 1, adoption of PWM control lengthens the total turn-on time or turn-off time, resulting in an equivalent decrease in switching speed, and it can be expected that the equivalent decrease in switching speed contributes to reduction of the breakdown possibility of the semiconductor device when an overcurrent occurs. However, since the decrease in the switching speed increases the switching loss in the steady state, it does not contribute to an improvement in the trade-off between the reduction of the switching loss in the steady state and the reduction of the possibility of damage to the semiconductor device under an abnormal state in which an overcurrent occurs.

The present disclosure has been made to solve such a problem, and an object of the present disclosure is to control switching of a semiconductor device so that the possibility of damage under an overcurrent abnormality is reduced while restraining the influence on the switching loss in a normal state.

Solution to Problem

According to an aspect of the present disclosure, a driving method for a semiconductor device is provided. The driving method for a semiconductor device to be turned on and off according to a drive control signal, includes: (a) starting a turn-on operation that charges a gate of the semiconductor device under an OFF-state in response to a turn-on command with a transition of the drive control signal from a first level to a second level; (b) starting a turn-off operation that discharges the gate of the semiconductor device under an ON-state in response to a turn-off command with a transition of the drive control signal from the second level to the first level; and (c) arranging at least one of a voltage drop period that is provided within a period in which the drive control signal is maintained at the second level after start of the turn-on operation, and a voltage rising period that is provided within a period in which the drive control signal is maintained at the first level after start of the turn-off operation. The voltage drop period is provided such that a voltage of the gate temporarily drops due to discharge of the gate after end of a Miller period. The voltage rising period is provided such that the voltage of the gate temporarily rises due to charge of the gate during a period in which a current of the semiconductor device is decreasing.

According to another aspect of the present disclosure, a driving device for a semiconductor device is provided. The driving device for a semiconductor device to be turned on and off according to a drive control signal, includes: a drive adjuster, and a drive circuit. The drive adjuster generates a drive signal for controlling a turn-on operation of charging a gate of the semiconductor device under an OFF-state and a turn-off operation of discharging the gate of the semiconductor device under an ON-state in response to a turn-on command with a transition of the drive control signal from a first level to a second level and a turn-off command with a transition of the drive control signal from the second level to the first level. The drive circuit charges or discharges the gate according to the drive signal. The drive adjuster generates the drive signal so as to arrange at least one of a voltage drop period that is provided within a period in which the drive control signal is maintained at the second level after start of the turn-on operation, and a voltage rising period that is provided within a period in which the drive control signal is maintained at the first level after start of the turn-off operation. The voltage drop period is provided such that a voltage of the gate temporarily drops due to discharge of the gate after end of a Miller period. The voltage rising period is provided such that the voltage of the gate temporarily rises due to charge of the gate during a period in which a current of the semiconductor device is decreasing.

According to another aspect of the present disclosure, a power conversion apparatus is provided. The power conversion apparatus includes: a main conversion circuit that is configured to include at least one semiconductor device, converts input power, and outputs the converted power; and a control circuit that outputs a control signal for controlling the main conversion circuit to the main conversion circuit. The control signal includes a drive control signal for each semiconductor device. The main conversion circuit further includes the driving device arranged in association with each semiconductor device. The driving device controls ON/OFF of each semiconductor device according to the drive control signal.

Advantageous Effects of Invention

According to the present disclosure, by temporarily providing the voltage drop period after the end of the Miller period during the turn-on operation, it is possible to restrain an increase in the drain current of the semiconductor device under a short-circuit state, and by temporarily providing the voltage rising period during the turn-off operation, it is possible to restrict the surge voltage that occurs when the semiconductor device is turned off in a short-circuited state. Therefore, it is possible to control the switching of the semiconductor device such that the possibility of damage in an overcurrent abnormal state is reduced while restraining the influence on the switching loss in a normal state.

BRIEF DESCRIPTION OF DRAWINGS

FIG. 19 is a block diagram showing a configuration example of a driving device according to a third embodiment.

DESCRIPTION OF EMBODIMENTS

Figures 1, 2:
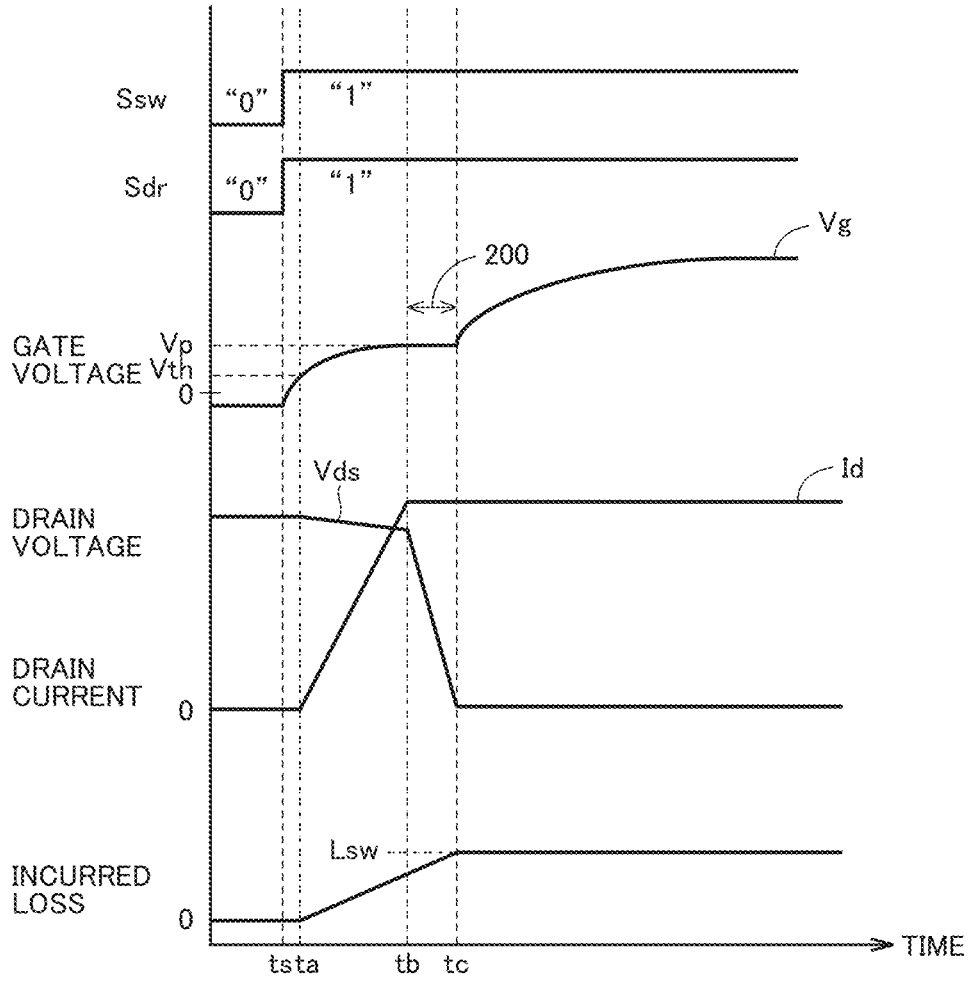
FIG. 1 is a block diagram showing a function of a driving device according to an embodiment.
FIG. 2 is a general operation waveform diagram in a turn-on operation under a normal state of a semiconductor device.

Embodiments of the present disclosure will be hereunder described in detail with reference to the drawings. In the following description, a plurality of embodiments will be described, but it is confirmatively disclosed that configurations described in the respective embodiments can be appropriately combined within a technically consistent range, including combinations not directly described in the specification, and this is planned from the time of the filing of the present application. Further, in the following description, the same reference signs are given to the same or corresponding parts in the drawings, and the description thereof will not be repeated in principle.

First Embodiment

FIG. 1 is a block diagram showing a function of a driving device according to the present embodiment.

A driving device 100 controls ON/OFF, that is, a switching operation of a semiconductor device 10 connected between a high voltage terminal N1 and a low voltage terminal N2 according to a drive control signal Ssw from a control circuit 20. Semiconductor device 10 has a drain 11 and a source 12 as main electrodes, and a gate 15 as a control electrode. The drain is connected to high voltage terminal N1, and source 12 is connected to low voltage terminal N2. When semiconductor device is turned on, a current path including semiconductor device 10 under an ON state and a load (not shown) electrically connected to high voltage terminal N1 or low voltage terminal N2 is formed. In the present embodiment, an MOS-FET is exemplified as semiconductor device 10 having a gate, but semiconductor device 10 may also be an IGBT. In this case, instead of the drain and the source, a collector and an emitter are set as main electrodes.

Semiconductor device 10 is controlled to be set to any one of a connection state (ON-state) in which current is generated between the main electrodes, that is, between drain 11 and source 12 and an OFF-state in which the connection between drain 11 and source 12 is cut off, according to the voltage between the gate and the source (hereinafter also simply referred to as a "gate voltage"). Driving device 100 controls the gate voltage so that semiconductor device 10 turns on and off according to drive control signal Ssw.

Drive control signal Ssw is set to "1" during a period when semiconductor device 10 should be turned on, and is set to "0" during a period when semiconductor device 10 should be turned off. In other words, the drive control signal is a binary signal which is set to either "0" corresponding to a "first level" or "1" corresponding to a "second level". For example, control circuit 20 can be configured by a PWM pulse output circuit for causing semiconductor device 10 to perform an ON/OFF operation according to pulse width modulation (PWM) control.

Semiconductor device 10 is turned on when the gate voltage becomes a positive voltage exceeding a predetermined threshold voltage Vth. Therefore, during a period when drive control signal Ssw is "1", drive device 100 drives gate 15 so that the gate voltage becomes a positive voltage exceeding threshold voltage Vth. On the other hand, during a period when drive control signal Ssw is "0", drive device 100 drives gate so that the gate voltage becomes voltage which is equal to the threshold voltage or less, for example, 0 or a negative voltage.

When drive control signal Ssw changes from "0" to "1", driving device 100 drives gate 15 so as to increase the gate voltage in order to perform a turn-on operation for changing semiconductor device 10 from the OFF-state to the ON-state. In other words, driving device 100 charges gate 15 at the turn-on time.

On the other hand, when drive control signal Ssw changes from "1" to "0", drive device 100 drives gate 15 so as to decrease the gate voltage in order to perform a turn-off operation for changing semiconductor device 10 from the ON-state to the OFF-state. In other words, driving device 100 discharges gate 15 at the turn-off time.

It is known that semiconductor device 10 itself consumes energy during the switching operation, that is, the turn-on operation and the turn-off operation of semiconductor device 10. In the following description, this energy consumption is also referred to as a switching loss. If the switching loss occurs, it causes heat generation in semiconductor device 10, and thus it is desirable that the switching loss is as small as possible.

FIG. 2 is a general operation waveform diagram showing a turn-on operation under a normal state of the semiconductor device. When semiconductor device 10 is turned on, the current in the current path containing the load (not shown) flows through semiconductor device 10 as described above. Note that each voltage and each current in each of the following waveform diagrams including FIG. 2 are assumed to be a voltage and a current which are measured through a gate terminal, a drain terminal and a source terminal from the outside of semiconductor device 10.

Referring to FIG. 2, before time ts, semiconductor device 10 is in the OFF-state in which the main electrodes (the drain and the source) are cut off, and a voltage Vds between the drain and the source (hereinafter also simply referred to as a "drain voltage Vds") which is the voltage between the main electrodes is (Vdd-Vss), and a current Id between the drain and the source (hereinafter also simply referred to as a "drain current Id") which is the current between the main electrodes is equal to 0.

At time ts, driving device 100 starts to charge gate 15 in response to the change of drive control signal Ssw from "0" to "1". In other words, the turn-on operation starts at time ts. For example, during a period of Ssw="1", gate 15 is connected to a power supply node for supplying a predetermined ON-voltage VH. As a result, the gate voltage starts to rise from time ts.

At time ta, a gate voltage Vg exceeds threshold voltage Vth, so that drain voltage Vds starts to drop, and drain current Id starts to rise. After time ta, drain voltage Vds gradually decreases and drain current Id gradually increases, so that semiconductor device 10 is gradually conductive.

After time ts, gate voltage Vg rises as parasitic capacitance of gate 15 is charged. Therefore, even if gate 15 starts to be charged in accordance with the change in drive control signal Ssw, gate voltage Vg does not rise immediately, and shows voltage behavior as shown in FIG. 2.

It is known that the parasitic capacitance (gate capacitance) of gate 15 is not constant and has dependency on drain voltage Vds. In particular, when drain voltage Vds drops, feedback capacitance which is the capacitance between the gate and the drain is added to the gate capacitance as apparent gate capacitance (so-called Miller capacitance).

The Miller capacitance has dependence on the drain voltage, and increases as drain voltage Vds decreases. However, when drain voltage Vds decreases sufficiently, the increase stops and no further increase occurs. Therefore, the change in gate voltage Vg is not uniform, and a period called a Miller period 200 during which gate voltage Vg does not rise occurs between times tb and tc which correspond to a period until the increase of the Miller capacitance stops. In other words, the start time and end time of the Miller period are time tb and time tc. In the following description, gate voltage Vg in Miller period 200 is also referred to as a Miller voltage Vp.

Although drain voltage Vds continues to decrease during Miller period 200, Vds is approximately equal to 0 at the same time when Miller period 200 ends. Therefore, at time tc when Miller period 200 ends, the main electrodes (the drain and the source) of semiconductor device 10 become conductive, and the turn-on ends. After the end of Miller period 200, gate voltage Vg continues to rise, and then reaches a predetermined voltage (a charging voltage by driving device 100) and saturates.

Since both drain current Id and drain voltage Vds have finite values, the power (Vds·Id) corresponding to a product of both drain current Id and drain voltage Vds is consumed in semiconductor device 10 at the turn-on time. Before time ta (before turn-on), switching power Psw is equal to 0 because drain current Id is cut off (Id=0). However, after time ta, (Vds·Id)>0 is satisfied, resulting in occurrence of power loss. In FIG. 2, an integrated value of power loss at the turn-on time is indicated as "incurred loss". The incurred loss corresponds to the switching loss described above.

Since drain voltage Vds=0 is satisfied after the end of Miller period 200, (Vds·Id)=0 is satisfied again. Therefore, it is understood that a switching loss Lsw obtained by integrating (Vds·Id) between times ta and tc occurs as the energy to be consumed due to the turn-on of semiconductor device 10. In other words, after time tc when Vds becomes 0, that is, after Miller period 200, no power loss occurs.

Figure 3:
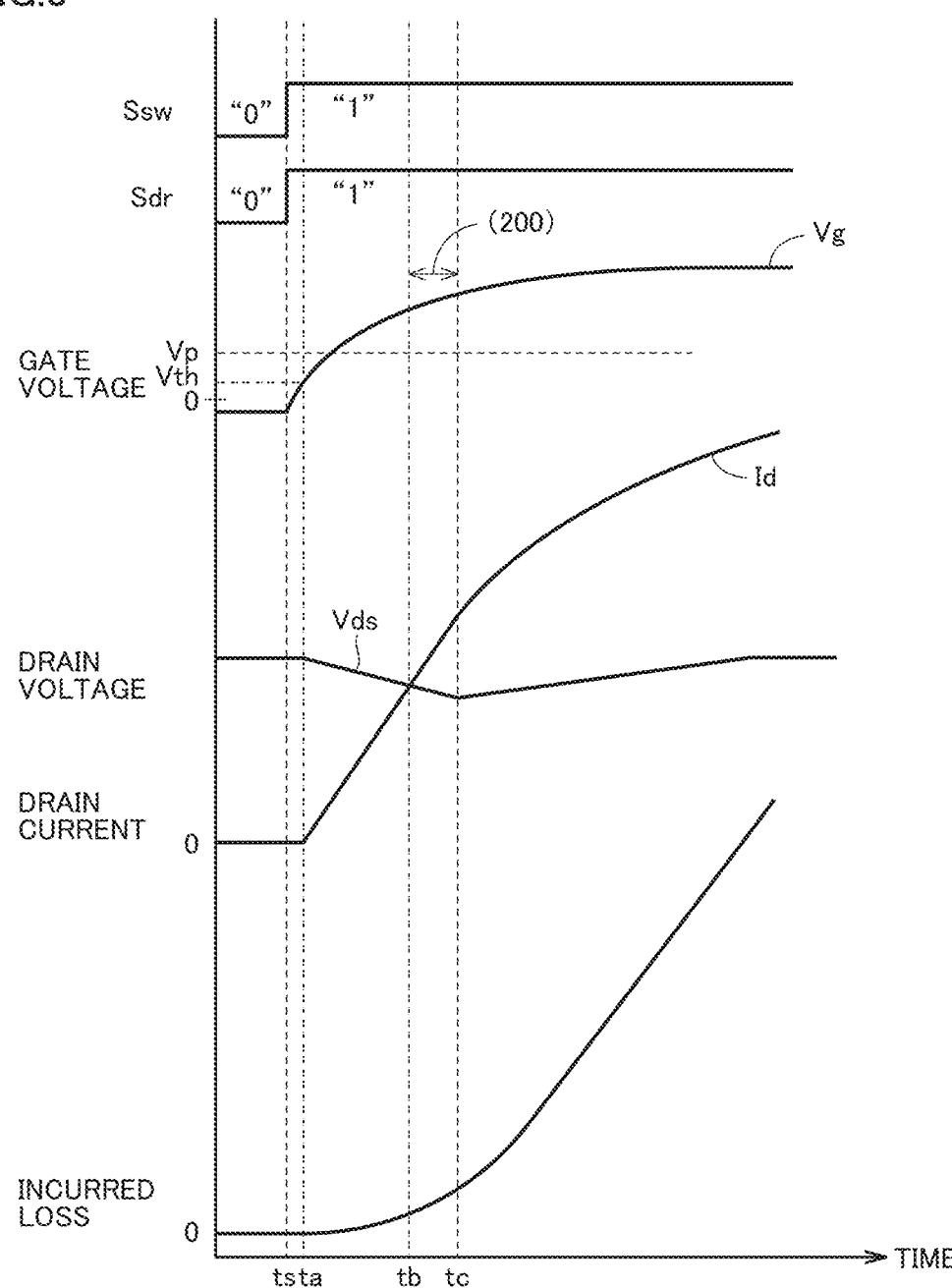
FIG. 3 is a general operation waveform diagram in the turn-on operation under an abnormal state of the semiconductor device.

FIG. 3 shows a general operation waveform diagram in a case where an overcurrent occurs in response to the turn-on of semiconductor device 10 (hereinafter also referred to as a turn-on operation under the abnormal state). FIG. 3 illustrates, as a representative example of overcurrent, an operation waveform in a case where a short-circuit path is formed due to turn-on semiconductor device 10.

In FIG. 3, the behaviors of gate voltage Vg, drain voltage Vds, and drain current Id from time ts to time ta are the same as those in FIG. 2 (under a normal state). However, the behavior of gate voltage Vg after time ta is significantly different from that in FIG. 2 (under the normal state). Specifically, after time ta, gate voltage Vg continues to rise until it reaches a predetermined voltage (charging voltage by driving device 100), including the same time period from tb to tc as that in FIG. 2.

This is because at time tb, semiconductor device 10 is turned on to form a short-circuit path, so that drain voltage Vds remains almost unchanged and Miller period 200 as shown in FIG. 2 does not occur. In other words, since the feedback capacitance which is the capacitance between the gate and the drain does not change, the parasitic capacitance (gate capacitance) of gate 15 does not increase, and thus remains substantially constant. Therefore, the gate capacitance when a short-circuit path is formed due to turn-on of semiconductor device 10 has a smaller value as compared with that in the turn-on operation under the normal state (FIG. 2).

Figure 4:
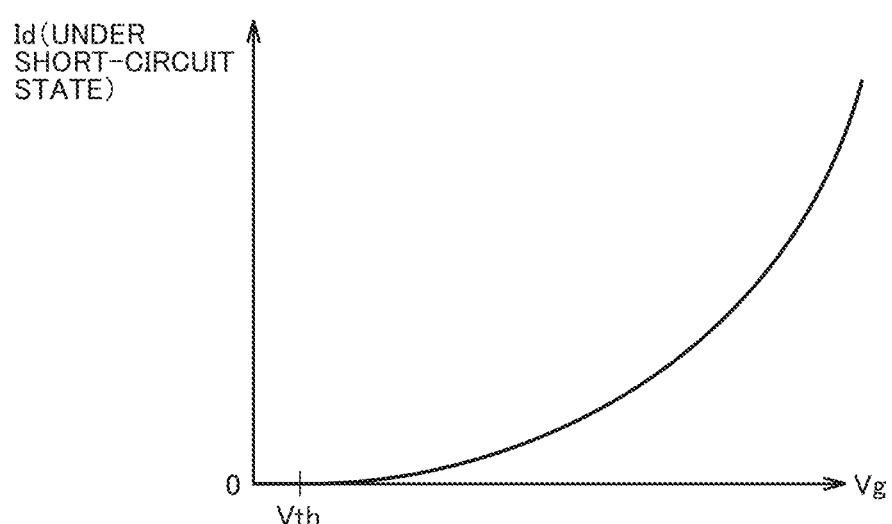
FIG. 4 is a graph showing relationship between a gate voltage and a drain current when a short-circuit current flows through the semiconductor device.

FIG. 4 shows a graph showing relationship between gate voltage Vg and drain current Id when a short-circuit current flows through semiconductor device 10.

As can be understood from FIG. 4, drain current Id changes depending on gate voltage Vg. Specifically, a characteristic in which drain current Id increases as gate voltage Vg increases is shown. Therefore, in the turn-on operation of semiconductor device 10 under the abnormal state, drain current Id continues to increase as gate voltage Vg rises while gate 15 is being charged by a driving circuit 150 as shown in the operation waveform example of FIG. 3. Furthermore, when gate voltage Vg is saturated, drain current Id is also saturated with a magnitude dependent on gate voltage Vg.

As a result, as shown in FIG. 3, the incurred loss of the semiconductor device when an overcurrent occurs due to the turn-on of semiconductor device 10 is much higher than that in the turn-on operation under the normal state shown in FIG. 2. If the incurred loss at this time exceeds the breakdown energy of semiconductor device 10, semiconductor device 10 would be broken down.

In order to avoid semiconductor device 10 from being broken down due to an overcurrent, a protection circuit for turning off semiconductor device 10 or cutting off the short-circuit current path in response to detection of an overcurrent is arranged for semiconductor device 10. However, as described above, if the time from the start of turn-on until the incurred loss has reached the breakdown energy of semiconductor device 10 under the abnormal state is short, there is a concern that semiconductor device 10 would be broken down before the protection circuit operates effectively.

When semiconductor device 10 is normally turned on, drain current Id does not have any dependence on gate voltage Vg as shown in FIG. 4. Therefore, in the operation waveform of FIG. 2, after Miller period 200, gate voltage Vg increases, but drain current Id does not increase and keeps a current value in Miller period 200.

In the turn-on operation under the normal state shown in FIG. 2, the incurred loss incurred when semiconductor device 10 is turned on is smaller as the switching speed is higher. On the other hand, in the turn-on operation under the abnormal state shown in FIG. 3, the gate voltage rises faster as the switching speed is higher, so that drain current Id increases, and thus the increasing speed of the incurred loss also increases. As a result, the time from the start of turn-on until the incurred loss has reached the breakdown energy of semiconductor device 10 is shorter as the switching speed is higher.

In other words, the increase of the switching speed of semiconductor device 10 reduces the incurred loss under the normal state, but increases the possibility of breakdown of semiconductor device 10 under the abnormal state accompanied by an overcurrent. In the first embodiment, the switching control at the turn-on time for improving such a trade-off will be described.

Figure 5:
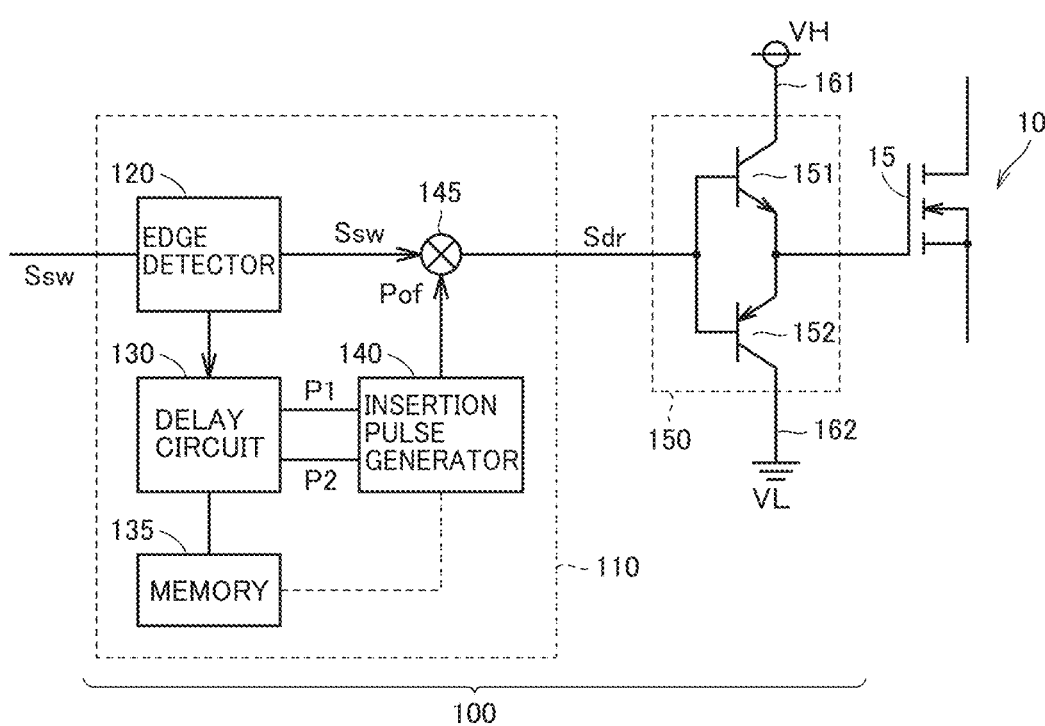
FIG. 5 is a block diagram showing a configuration example of the driving device according to a first embodiment.
Figure 6:
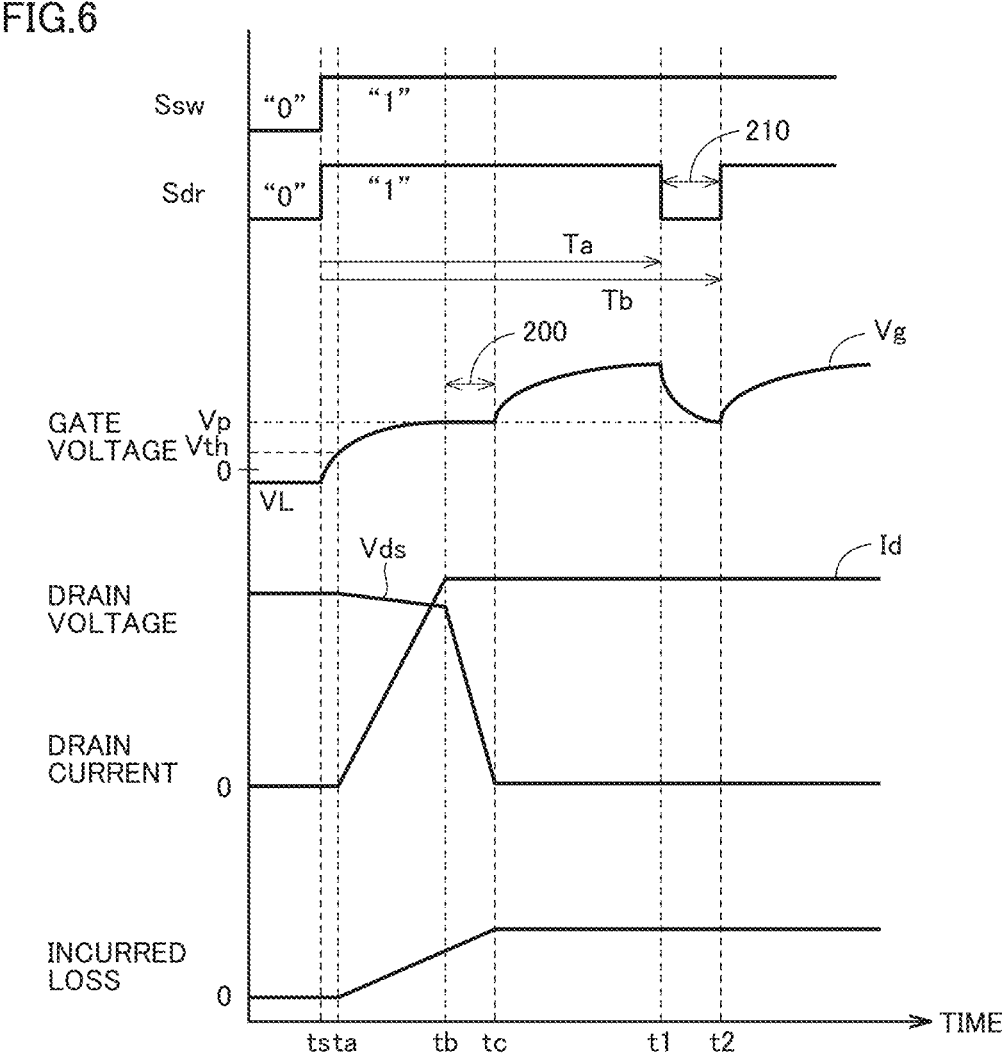
FIG. 6 is an operation waveform diagram under a normal state of the semiconductor device which is turned on by the driving device according to the first embodiment.

FIG. 5 is a block diagram showing a configuration example of driving device 100 according to the first embodiment. FIG. 6 shows an operation waveform diagram in the turn-on operation under the normal state of the semiconductor device which is subjected to ON/OFF-control by driving device 100 shown in FIG. 5.

With reference to FIG. 5, driving device 100 includes a drive adjuster 110 and drive circuit 150.

As can be understood from the comparison between FIGS. 6 and 2, driving device 100 according to the first embodiment drives semiconductor device 10 so that drive control signal Ssw is kept at "1" at the turn-on time when drive control signal Ssw transits from "0" to "1" and a voltage drop period 210 during which a drive signal Sdr is set to "O" is provided. As shown in FIG. 6, in voltage drop period 210, semiconductor device 10 is driven such that gate voltage Vg begins to drop.

As shown in FIG. 5, drive adjuster 110 generates drive signal Sdr provided with voltage drop period 210 (FIG. 6) described above based on drive control signal Ssw. Drive adjuster 110 includes an edge detector 120, a delay circuit 130, a memory 135, an insertion pulse generator 140, and a signal synthesizer 145. The function of each component of drive adjuster 110 may be implemented by a dedicated electronic circuit (hardware), or may be implemented by program processing (software).

Note that memory 135 is a concept representing a component for recording time, and stores a predetermined length (time length) of elapsed time starting from the start of turn-on in advance as described later. Specifically, memory 135 is configured to store time lengths Ta and Tb that respectively define the start timing and end timing of voltage drop period 210 in FIG. 6. In other words, a relationship of Tb>Ta is satisfied between Ta and Tb.

Memory 135 can be configured to include a digital circuit for storing above Ta and Tb as digital values. Alternatively, memory 135 may also be configured to include an analog circuit for providing delay times corresponding to Ta and Tb which are determined by the circuit constants of passive components, the number of inverter stages, or the like.

When drive control signal Ssw changes from "0" to "1" at time ts, edge detector 120 detects a turn-on command and generates a one-shot pulse. In other words, time ts corresponds to the turn-on start timing. A one-shot pulse from edge detector 120 is input to delay circuit 130. Furthermore, edge detector 120 transmits drive control signal Ssw to signal synthesizer 145.

Delay circuit 130 generates a first pulse P1 obtained by delaying the one-shot pulse from edge detector 120 by Ta and a second pulse P2 obtained by delaying the one-shot pulse from edge detector 120 by Tb, and inputs them to insertion pulse generator 140.

Insertion pulse generator 140 can detect the start timing and end timing of voltage drop period 210 with first pulse P1 and second pulse P2. For example, insertion pulse generator 140 generates an OFF-pulse signal Pof which is set to "0" during the period from the reception time of the first pulse P1 until the reception time of the second pulse and is set to "1" in other periods during the turn-on operation.

Time lengths Ta and Tb which respectively define the start timing and end timing of voltage drop period 210 are set based on the operation waveform in the turn-on operation under the normal state of semiconductor device 10 when drive signal Sdr is fixed to "1" after time ts shown in FIG. 2. In the first embodiment, time lengths Ta and Tb are determined so that voltage drop period 210 is set after Miller period 200 (from time tb to time tc). Further, the time length of voltage drop period 210, that is, (Tb−Ta), is set such that a period in which gate voltage Vg turns to dropping occurs.

Signal synthesizer 145 in FIG. 5 generates drive signal Sdr by performing a logical product (AND) operation between drive control signal Ssw and OFF-pulse signal Pof from insertion pulse generator 140. As a result, as shown in FIG. 6, drive signal Sdr has a waveform in which drive signal Sdr is set to "0" from a time t1 when time length Ta has elapsed from time ts until time t2 when time length Tb has elapsed from time ts, and set to "1" in other periods. As a result, voltage drop period 210 is provided in drive signal Sdr.

Drive circuit 150 in FIG. 5 has a transistor 151 connected between a power supply node 161 and gate 15, and a transistor 152 connected between gate 15 and a power supply node 162. Power supply node 161 supplies an ON-voltage VH (VH>Vth) which is a positive voltage for charging gate 15. Power supply node 162 supplies an OFF-voltage VL for turning off semiconductor device 10. In the present embodiment, OFF-voltage VL is set as a negative voltage for the source, but it is also possible to use a voltage Vss (FIG. 1) having the same potential as the source. In other words, power supply node 162 corresponds to one example of a "first voltage terminal", and power supply node 161 corresponds to one example of a "second voltage terminal". Also, OFF-voltage VL and ON-voltage VH correspond to the "first voltage" and the "second voltage", respectively.

The gates of transistors 151 and 152 are connected in common and receive drive signal Sdr from drive adjuster 110. During the period of drive signal Sdr="1", transistor 151 is turned on, whereas transistor 152 is turned off, so that gate 15 is connected to power supply node 161 for supplying ON-voltage VH. As a result, gate is charged.

On the other hand, during the period of drive signal Sdr="0", transistor 152 is turned on, whereas transistor 151 is turned off, so that gate 15 is connected to power supply node 162 for supplying OFF-voltage VL. Therefore, it is understood that during voltage drop period 210, gate 15 is temporarily discharged.

Next, with reference to FIG. 6, voltage and current waveforms of semiconductor device 10 which are normally turned on by driving device 100 according to the first embodiment will be described.

During the period from time ts until time t1 when voltage drop period 210 starts, drive signal Sdr is set to "1" according to drive control signal Ssw. Therefore, from time ts to time t1, the waveforms of gate voltage Vg, drain voltage Vds, and drain current Id are similar to those shown in FIG. 2. As a result, in FIG. 6 as well, when a turn-on command is issued at time ts which is the same as that in FIG. 2, gate voltage Vg exceeds threshold voltage Vth at time ta which is the same as that in FIG. 2, is kept to a constant value during the period from time tb to time tc (Miller period 200) which are the same as those in FIG. 2, and then rises toward ON-voltage VH.

According to such transition of gate voltage Vg, similarly to FIG. 2, drain voltage Vds starts to drop and drain current Id starts to rise at time ta. Then, at time tc when Miller period 200 ends, Vds drops to 0. Therefore, the incurred loss up to this point is the same value similarly to FIG. 2.

In FIG. 6, in voltage drop period 210 provided after Miller period 200, drive signal Sdr is set to "0", so that drive circuit 150 discharges gate 15 by turn-on of transistor 152. As a result, gate voltage Vg drops during the period from time t1 to time t2.

After time t2, drive signal Sdr is set to "1" again, so that drive circuit 150 charges gate 15 by turn-on of transistor 151. As a result, gate voltage Vg rises again toward ON-voltage VH.

Here, voltage drop period 210 is provided to have a short time length such that gate voltage Vg does not drop to Miller voltage Vp or less during voltage drop period 210. As a result, a case where gate voltage Vg drops to Miller voltage Vp or less and thus semiconductor device 10 shifts to the turn-off operation is avoided.

Therefore, in FIG. 6, the waveforms of drain current Id and drain voltage Vds are the same as those in FIG. 2 even during voltage drop period 210 (from time t1 to time t2) and after the end of voltage drop period 210 (after time t2).

As described above, the behaviors of drain voltage Vds and drain current Id of semiconductor device 10 which has been normally turned on by driving device 100 according to the first embodiment are the same as those in a general case where drive signal Sdr is kept at "1" without providing voltage drop period 210 (FIG. 2). As a result, it is understood that the incurred loss in the turn-on operation under the normal state does not increase even when voltage drop period 210 is provided.

Figure 7:
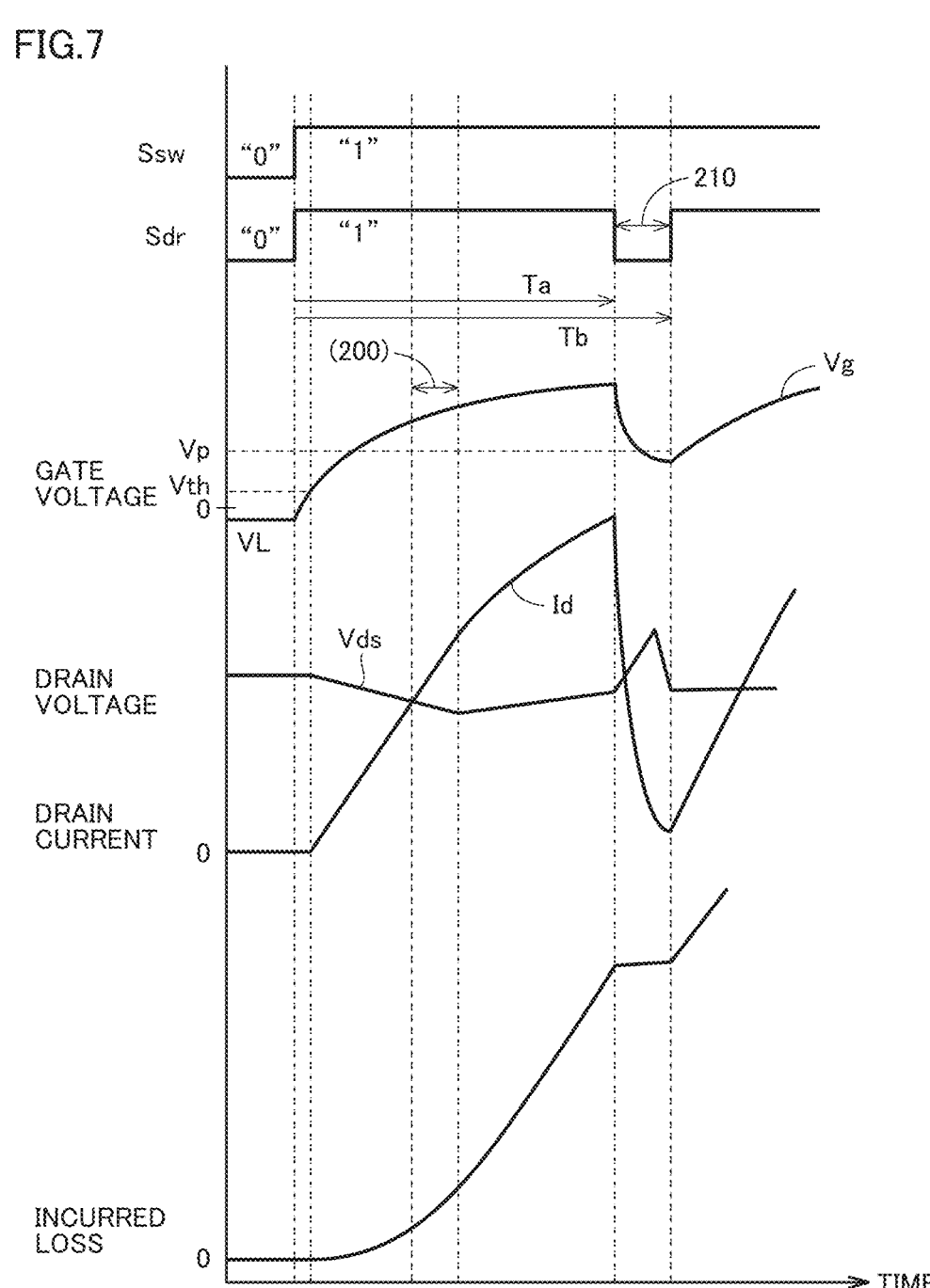
FIG. 7 is an operation waveform diagram under the abnormal state of the semiconductor device which is turned on by the drive device according to the first embodiment.

FIG. 7 shows an operation waveform diagram under an abnormality of semiconductor device 10 turned on by driving device 100 according to the first embodiment. In other words, similarly to FIG. 3, FIG. 7 shows voltage and current waveforms in a case where an overcurrent occurs due to the formation of a short-circuit path in response to the turn-on of semiconductor device 10 starting at time ts.

As shown in FIG. 7, drive signal Sdr is set to "1" between time ts and time t1 and then set to "0" between time t1 and time t2 similarly to FIG. 6, and after time t2, drive signal Sdr is set to "1". As a result, voltage drop period 210 similar to that in FIG. 6 is provided when semiconductor device 10 is turned on. In other words, driving device 100 according to the first embodiment sets drive signal Sdr in common between the normal state (FIG. 6) and the abnormal state (FIG. 7).

In the period from time ts to time t1 in FIG. 7, that is, the period from the start of turn-on until the start of voltage drop period 210, the waveforms of gate voltage Vg, drain voltage Vds, and drain current Id are the same as those in FIG. 3.

However, in FIG. 7, gate voltage Vg drops due to the discharge of gate 15 by drive circuit 150 during the period from time t1 to time t2 because voltage drop period 210 is provided. Such Miller period 200 as in the normal state (FIGS. 2 and 6) does not occur in the abnormal state of FIG. 7, so that the charge in gate 15 at time t1 is less than that at time t1 in the normal state (FIGS. 2 and 6). Therefore, if voltage drop period 210 is provided with the same period length, the drop amount of gate voltage Vg during voltage drop period 210 becomes larger than that in the normal state. As a result, in the operation waveform example of FIG. 8, gate voltage Vg drops to be lower than Miller voltage Vp during voltage drop period 210 unlike that in FIG. 6.

In voltage drop period 210, the behaviors of drain voltage Vds and drain current Id change from those shown in FIG. 3 according to the drop of gate voltage Vg described above. In particular, it is understood that drain current Id decreases according to the characteristic shown in FIG. 4. As a result, the increase in incurred loss is greatly suppressed during voltage drop period 210. In addition, following the decrease of drain current Id, drain voltage Vds momentarily increases due to occurrence of a surge voltage which is caused by parasitic inductance (typically, parasitic inductance of wiring) in a current path including semiconductor device 10.

Here, as can be understood from the difference in transition of the incurred loss between FIGS. 3 and 7, when semiconductor device 10 is turned on by driving device 100 according to the first embodiment, it is possible to extend a required time until the incurred loss exceeds the breakdown energy of semiconductor device 10 by providing voltage drop period 210. As a result, it is possible to reduce the possibility that semiconductor device 10 has been broken down before the protection circuit described above operates effectively.

As described above, according to driving device 100 according to the first embodiment, in the turn-on operation of semiconductor device 10, voltage drop period 210 is provided at a timing after the lapse of Miller period 200, whereby it is possible to control the switching of the semiconductor device such that the possibility of damage under an overcurrent abnormal state is reduced, while the influence on the switching loss in the normal state has been restrained.

As can be understood from the above description, the effect of reducing the incurred loss in the abnormal state is enhanced by lengthening voltage drop period 210. On the other hand, an upper limit of the time length of voltage drop period 210 is limited to a value that does not allow gate voltage Vg to drop up to Miller voltage Vp in the normal state. Further, the start timing of voltage drop period 210 in the turn-on operation is required to be set after the end of Miller period 200, but in order to suppress the increase in drain current Id in the abnormal state, it is desired that the start timing is set not to be too late.

However, since the behavior at the turn-on time differs according to the characteristics of semiconductor device 10, it is assumed that the optimal values for the start timing and the end timing (that is, the start timing and the time length) of voltage drop period 210 differ depending on the characteristics of semiconductor device 10. Therefore, it is preferable that the optimal values suitable for the characteristics of semiconductor device 10 are obtained in advance by an actual machine test or simulation using semiconductor device 10 which is targeted to be subjected to switching control by driving device 100. Since the effect according to the above first embodiment is implemented by setting time lengths Ta and Tb which are prestored in memory 135 in association with the optimal values obtained in advance, it is possible to appropriately set at least one of the start timing and the time length of voltage drop period 210.

Modification of First Embodiment

Figure 8:
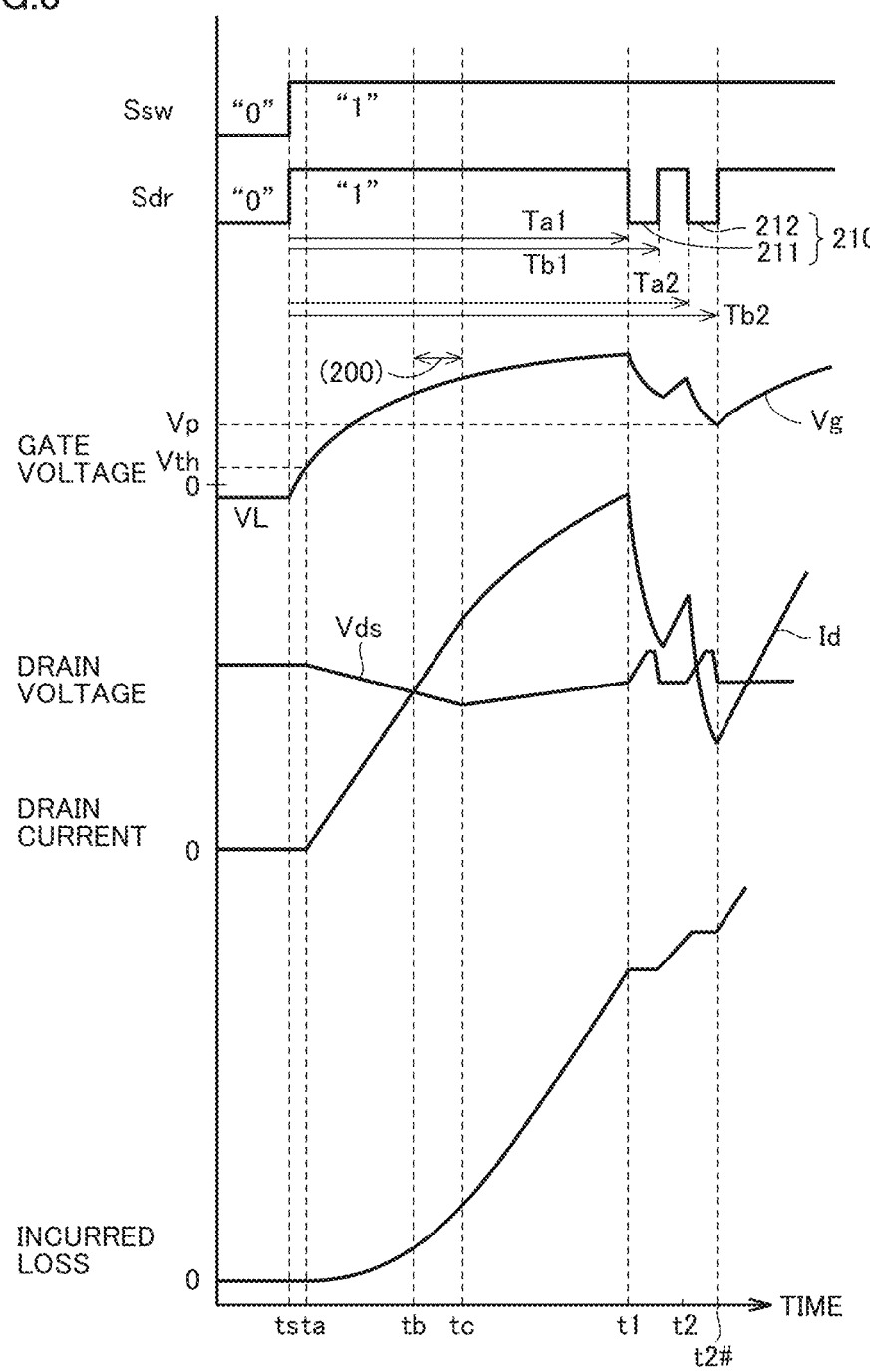
FIG. 8 is an operation waveform diagram under the abnormal state of a semiconductor device which is turned on by a driving device according to a modification of the first embodiment.

FIG. 8 shows an operation waveform diagram under an abnormal state of a semiconductor device which has been turned on by a driving device according to a modification of the first embodiment.

As can be understood from the comparison between FIGS. 8 and 7, the modification of the first embodiment is different from the first embodiment in that voltage drop period 210 is configured to include a plurality of divided drop periods 211 and 212.

In the example of FIG. 8, the start timing and the end timing of divided drop period 211 are defined by time lengths Ta1 and Tb1 that elapse from the turn-on start point (time ts). Similarly, the start timing and the end timing of divided drop period 212 provided after divided drop period 211 are defined by time lengths Ta2 and Tb2 that elapse from the turn-on start time (time ts) (Ta1<Tb1<Ta2<Tb2).

As a result, the drop period including divided drop periods 211 and 212 is provided between time t1 and time t2 #which is subsequent to the same time t2 as that in FIGS. 6 and 7. Voltage drop period 210 is configured by the plurality of divided drop periods 211 and 212 as described above, whereby the drop period of drain current Id and the occurrence period of the surge voltage are also divided. As a result, it is possible to restrict a variation amount (increase amount) of drain voltage Vds during voltage drop period 210.

Note that in the modification of the first embodiment, voltage drop period 210 is also required to be arranged such that gate voltage Vg does not drop up to Miller voltage Vp in the normal state after the end of Miller period 200 (FIGS. 2 and 6). Accordingly, although not shown, the waveforms of drain voltage Vds and drain current Id when semiconductor device 10 is normally turned on according to drive signal Sdr shown in FIG. 8 can be made similar to that in FIG. 6 (first embodiment).

The driving device according to the modification of the first embodiment can be implemented, for example, by modifying the configuration shown in FIG. 5 as follows. First, time lengths Ta1, Tb1, Ta2, and Tb2 described above are prestored in memory 135, and delay circuit 130 operates such that a total of four pulses are input to insertion pulse generator 140 according to lapses of time lengths Ta1, Tb1, Ta2, and Tb2 from time ts. Further, according to the four pulses, insertion pulse generator 140 operates so as to generate OFF-pulse signal Pof which is set to "0" in association with the timings of divided drop periods 211 and 212 in FIG. 8 and set to "1" in the other periods, whereby driving signal Sdr shown in FIG. 8 can be generated by signal synthesizer 145.

FIG. 8 shows an example in which voltage drop period 210 is configured by two divided drop periods 211 and 212, but the division number can be set to three or more. As described above, according to the driving device according to the modification of the first embodiment, in addition to the effect described in the first embodiment, it is possible to restrict the surge voltage during voltage drop period 210 in the turn-on operation under the abnormal state in which an overcurrent occurs.

Second Embodiment

As can be understood from the descriptions of the first embodiment and the modification thereof, it is important in the driving device according to the present embodiment to properly set the start timing and the time length of voltage drop period 210. In a second embodiment, there will be described a technique for variably adjusting voltage drop period 210 by using an information quantity regarding the operating state of semiconductor device 10 (at least one of gate voltage Vg, a gate current, drain voltage Vds, drain current Id, and temperature Tj).

Figure 9:
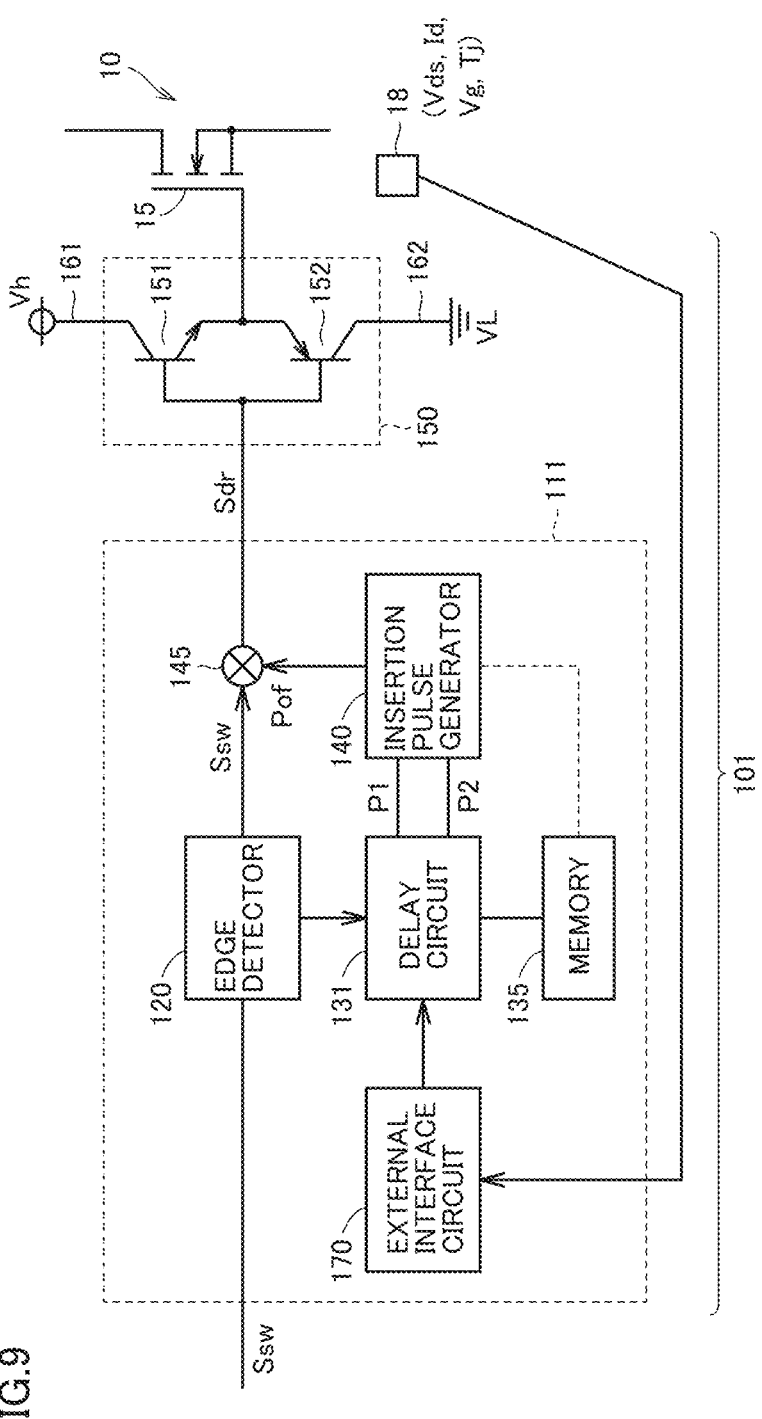
FIG. 9 is a block diagram showing a configuration example of a driving device according to a second embodiment.

FIG. 9 is a block diagram showing a configuration example of a driving device 101 according to the second embodiment.

As shown in FIG. 9, as compared with the configuration of driving device 100 according to the first embodiment (FIG. 5), driving device 101 according to the second embodiment is different in that driving device 101 has a drive adjuster 111 instead of drive adjuster 110. Drive adjuster 111 differs from drive adjuster 110 in that an external interface circuit 170 is added.

A detection value of detector 18 provided in semiconductor device 10 is input to external interface circuit 170. Detector 18 detects at least one of gate voltage Vg, the gate current, drain voltage Vds, drain current Id, and temperature Tj which are an information quantity ST regarding the operating state of semiconductor device 10 described above. The functions of edge detector 120, insertion pulse generator 140, and signal synthesizer 145 in drive adjuster 110 are the same as those in the first embodiment, and thus detailed description will not be repeated.

In the driving device 101 according to the second embodiment, drive adjuster 110 includes a delay circuit 131 instead of delay circuit 130 (FIG. 5) in the first embodiment. Delay circuit 131 acquires a value of information quantity ST via external interface circuit 170. Furthermore, delay circuit 131 has a function of variably adjusting at least one of the start timing and the period length of voltage drop period 210 according to information quantity ST. For example, delay circuit 131 is configured to generate first pulse P1 and second pulse P2 in such a manner that at least one of time lengths Ta and Tb defining voltage drop period 210 is corrected according to information quantity ST.

Insertion pulse generator 140 generates OFF-pulse signal Pof with first pulse P1 and second pulse P2 from delay circuit 131, which makes it possible to variably adjust at least one of the start timing and the time length of voltage drop period 210 provided in drive signal Sdr according to information quantity ST in driving device 101.

The switching operation of semiconductor device 10 changes depending on the variation in characteristics of semiconductor device 10 and the operating environment such as temperature. Therefore, when the start timing and the end timing of voltage drop period 210 are set fixedly, the setting should be performed with a margin which considers the variation in characteristics described above and the variation in the switching operation of semiconductor device 10 caused by the operating environment.

Therefore, in the second embodiment, the information quantity regarding the operating state of semiconductor device 10 is fed back to driving device 101 via external interface circuit 170 to variably adjust at least one of the start timing and the end timing of voltage drop period 210 according to the variation in the switching operation described above, thereby implementing the optimum switching operation.

Next, specific examples of the variable adjustment of voltage drop period 210 for information quantity ST will be sequentially described.

As a first example, drain voltage Vds of semiconductor device 10 can be used as information quantity ST.

Figure 10:
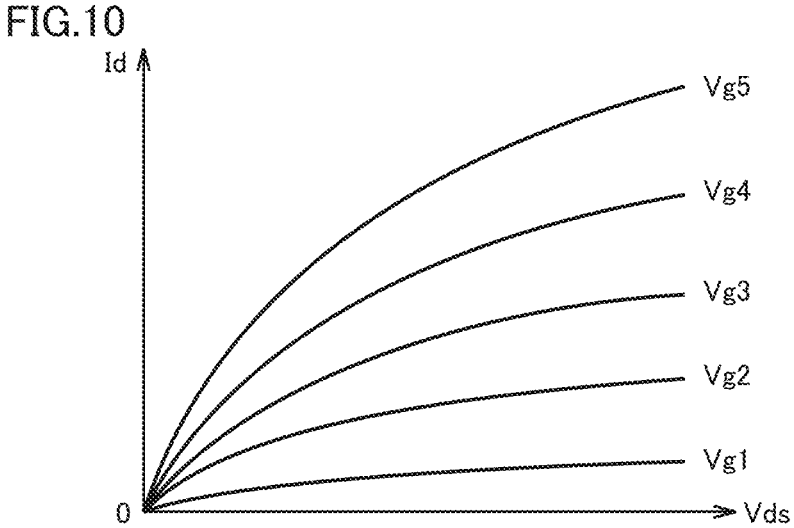
FIG. 10 is a typical drain voltage-drain current characteristic diagram of a semiconductor device.

FIG. 10 shows a general drain voltage-drain current characteristic diagram of semiconductor device 10.

As shown in FIG. 10, semiconductor device 10 has a drain voltage-drain current characteristic that differs depending on gate voltage Vg (Vg1 to Vg5 in FIG. 10), but has a characteristic in which drain current Id increase as drain voltage Vds increases for any gate voltage Vg.

Figure 11:
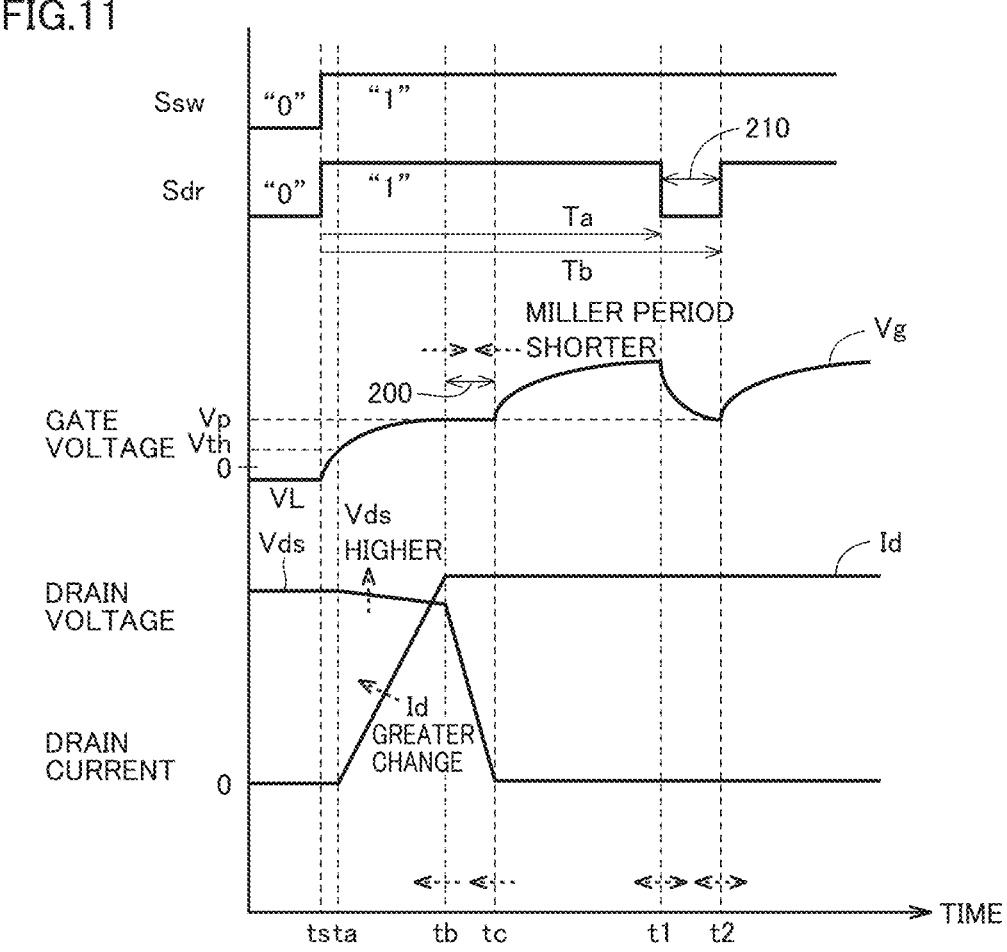
FIG. 11 is an operation waveform diagram showing variable adjustment of a dropping period when a drain voltage in the driving device according to the second embodiment is used as an information quantity.

FIG. 11 is an operation waveform diagram showing the variable adjustment of the drop period with drain voltage Vds set as information quantity ST. In FIG. 11, dotted lines indicate the influence on the switching operation of semiconductor device when drain voltage Vds increases before the start of Miller period 200.

As shown in FIG. 11, the change in drain current Id is faster as drain voltage Vds is higher. Therefore, the timing at which Miller period 200 occurs is earlier, and Miller period 200 is shorter. As a result, gate voltage Vg at time t1 corresponding to prestored time length Ta is also higher as drain voltage Vds is higher.

Therefore, with respect to voltage drop period 210, time lengths Ta and Tb are corrected such that as drain voltage Vds is higher, the start timing is advanced (time length Ta is reduced) and/or the period length is increased (Tb–Ta is increased), whereby it is possible to optimize at least one of the start timing and the time length of voltage drop period 210 in accordance with the actual switching operation of semiconductor device 10. This enhances the effect of extending the time required until the incurred loss in semiconductor device 10 under the abnormal state in which an overcurrent occurs exceeds the breakdown energy of semiconductor device 10, thereby further reducing the possibility that semiconductor device 10 has been broken down.

Figure 12:
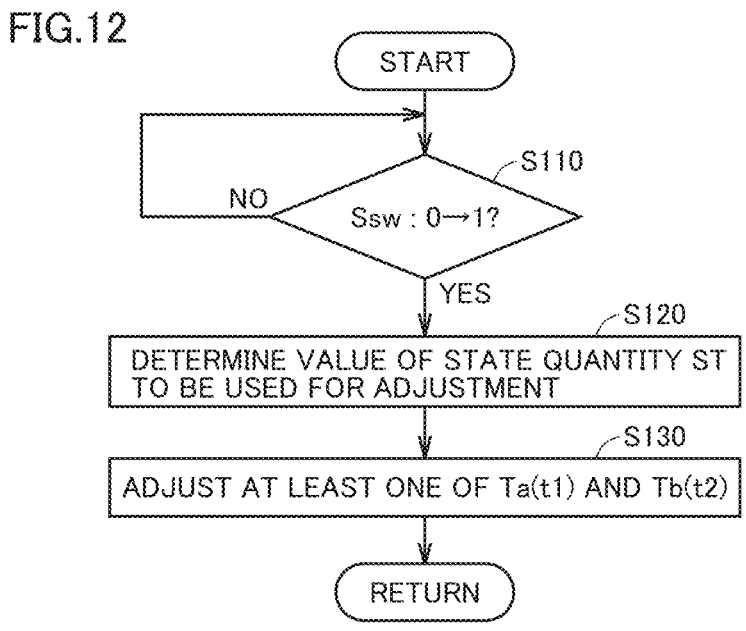
FIG. 12 is a first flowchart showing control processing for the variable adjustment of the dropping period in the drive device according to the second embodiment.

FIG. 12 shows a first flowchart showing control processing for the variable adjustment of the drop period in driving device 101 according to the second embodiment. In addition to the processing according to the flowchart shown in FIG. 12, driving device 101 can acquire a detection value by detector 18, that is, the information quantity regarding the operating state of semiconductor device via external interface circuit 170 in a constant cycle.

Referring to FIG. 12, driving device 101 detects the transition of drive control signal Ssw from "0" to "1", that is, a turn-on command to semiconductor device 10 in step (hereinafter simply referred to as "S") 110. The processing of S110 is equivalent to the function of edge detection unit 120.

When detecting the turn-on command (when YES determination is made in S110), driving device 101 executes the processing of S120 and S130. On the other hand, even when the turn-on operation is completed once and the processing is returned to "START", the processing subsequent to S120 is not executed until the turn-on command is detected (NO determination is made in S110).

In S120, driving device 101 determines the value of information quantity ST to be used for the variable adjustment of voltage drop period 210 from information quantity ST acquired in a constant cycle. For example, when drain voltage Vds before the start of Miller period 200 described with reference to FIG. 11 is used as information quantity ST, the value of information quantity ST to be used for the adjustment can be determined by extracting a detection value acquired at a predetermined timing which is contained before time ts (before the turn-on operation) or between time ts and time tb (after the start of turn-on and before the start of Miller period 200).

Based on the value of information quantity ST (in this case, drain voltage Vds) determined in S120, driving device 101 adjusts at least one of time length Ta defining time t1 (the start timing of voltage drop period 210) and time length Tb defining time t2 (the end timing of voltage drop period 210). For example, when drain voltage Vds described above is used as information quantity ST, it is possible to adjust at least one of time lengths Ta and Tb such that as drain voltage Vds is higher, the start timing of voltage drop period 210 is earlier and/or the time length of voltage drop period 210 is larger, and contrarily as drain voltage Vds is lower, the start timing of voltage drop period 210 is later and/or the time length of voltage drop period 210 is smaller.

Typically, the processing of S130 can be implemented by pre-storing, in memory 135, a lookup table or a functional expression for determining the optimal values of time lengths Ta and Tb for information quantity ST (drain voltage Vds). Note that the above-mentioned optimal values can be obtained in advance by a real machine test or simulation of the switching operation of semiconductor device 10 under the condition that information quantity ST (drain voltage Vds) is changed. Alternatively, when memory 135 is configured by the analog circuit described above, the analog circuit may also be provided with a variable mechanism for switching the circuit constant value or the number of inverter stages for information quantity ST (drain voltage Vds).

As described above, by executing the processing of S120 and S130 for each turn-on command of semiconductor device 10, it is possible to appropriately variably adjust at least one of the start timing and the time length of voltage drop period 210 by feedback of the information quantity (in this case, drain voltage Vds) regarding the operating state of semiconductor device 10.

As a second example, it is also possible to feed back drain current Id of semiconductor device 10 as information quantity ST.

Figure 13:
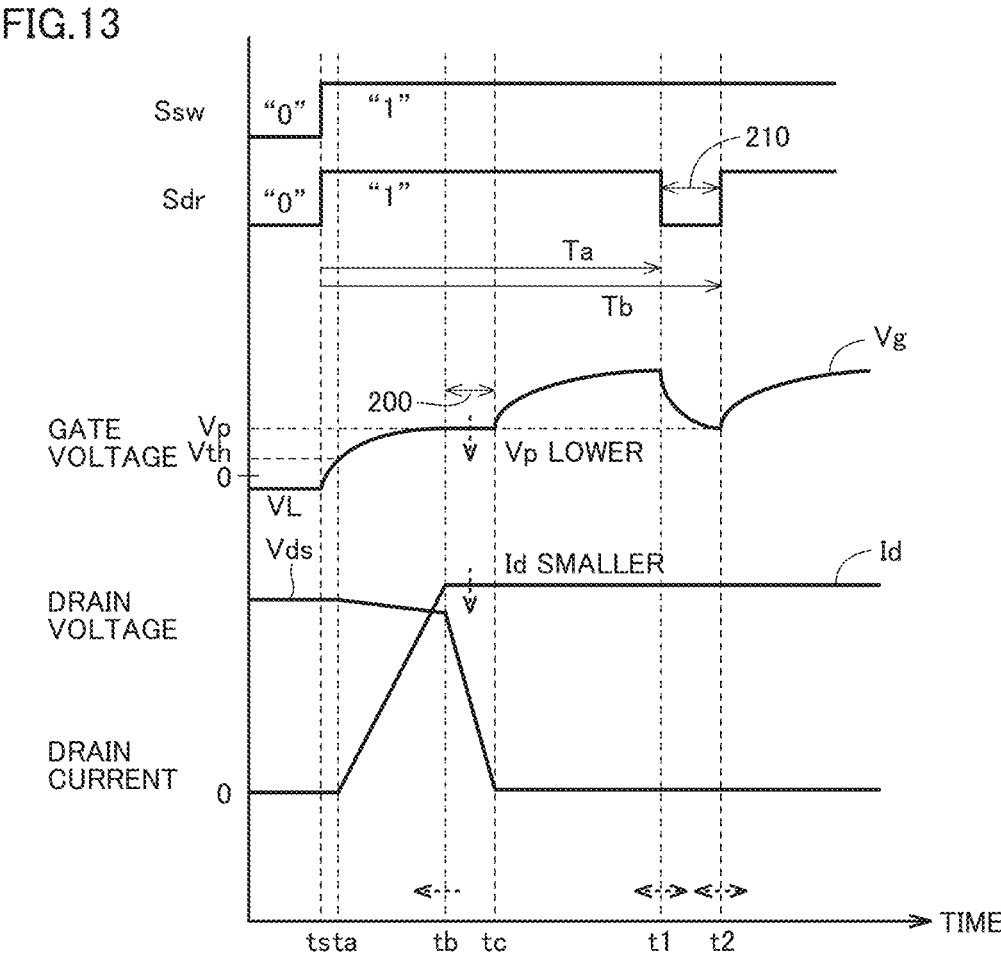
FIG. 13 is an operation waveform diagram showing the variable adjustment of the dropping period when the drain current in the driving device according to the second embodiment is used as the information quantity.

FIG. 13 is an operation waveform diagram showing the variable adjustment of the drop period when drain current Id is set as information quantity ST. In FIG. 13, dotted lines indicate the influence on the switching operation of semiconductor device when drain current Id decreases after turn-on.

As shown in FIG. 13, when drain current Id is small, Miller voltage Vp in Miller period 200 decreases. As a result, the occurrence timing of Miller period 200 is earlier, and the drop amount of gate voltage Vg that is allowed in voltage drop period 210 increases.

Therefore, with respect to voltage drop period 210, time lengths Ta and Tb are corrected such that the start timing is advanced (time length Ta is reduced) and/or the period length is increased (Tb−Ta is increased) as drain current Id is smaller, whereby it is possible to optimize at least one of the start timing and the time length of voltage drop period 210 in accordance with the actual switching operation of semiconductor device 10.

When drain current Id of semiconductor device 10 is used as information quantity ST, the control processing applied to the flowchart of FIG. 12 can also be applied. At this time, in S120, driving device 101 can extract drain current Id in the previous turn-on operation of semiconductor device 10 (after time tb), and determine information quantity ST to be used for the variable adjustment of voltage drop period 210.

Alternatively, in S120, it is also possible to determine information quantity ST to be used for the variable adjustment of voltage drop period 210 by predicting drain current Id using the current value of a load (not shown) before the current turn-on operation. In this case, it is necessary to arrange detector 18 in accordance with the load (not shown).

In this way, the position and the time length of voltage drop period 210 can also be appropriately variably adjusted by feedback of drain current Id of semiconductor device 10.

As a third example, it is also possible to feed back temperature (device temperature) Tj of semiconductor device 10 as information quantity ST.

Figure 14:
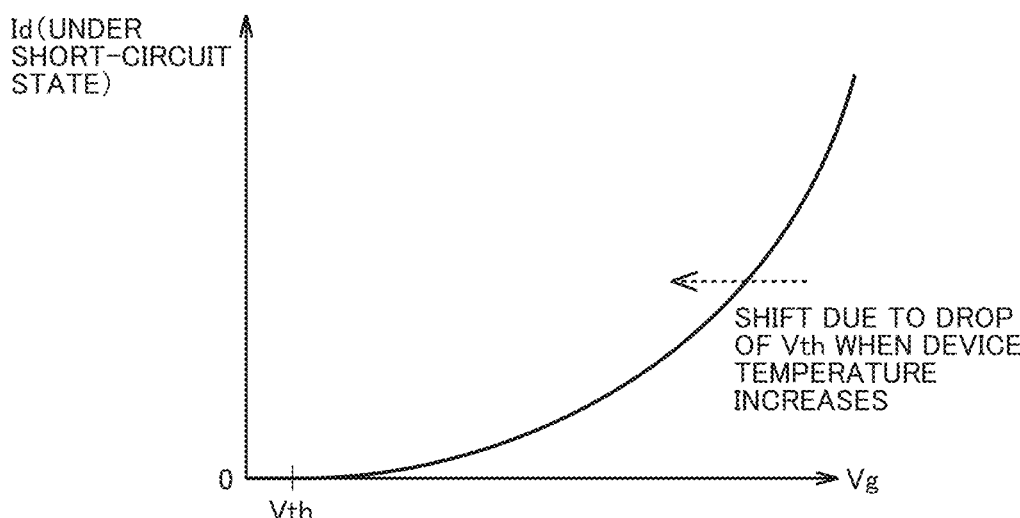
FIG. 14 is a graph showing temperature dependence of FIG. 4.

FIG. 14 shows a graph showing the temperature dependence of the relationship between gate voltage Vg and drain current Id when a short-circuit current flows through semiconductor device 10 shown in FIG. 4.

As shown in FIG. 14, when device temperature Tj of semiconductor device 10 increases, threshold voltage Vth of semiconductor device 10 decreases. As a result, the characteristic line of gate voltage Vg—drain current Id (under short-circuit) shifts to the left in the figure. In other words, drain current Id increases with respect to same gate voltage Vg.

Figure 15:
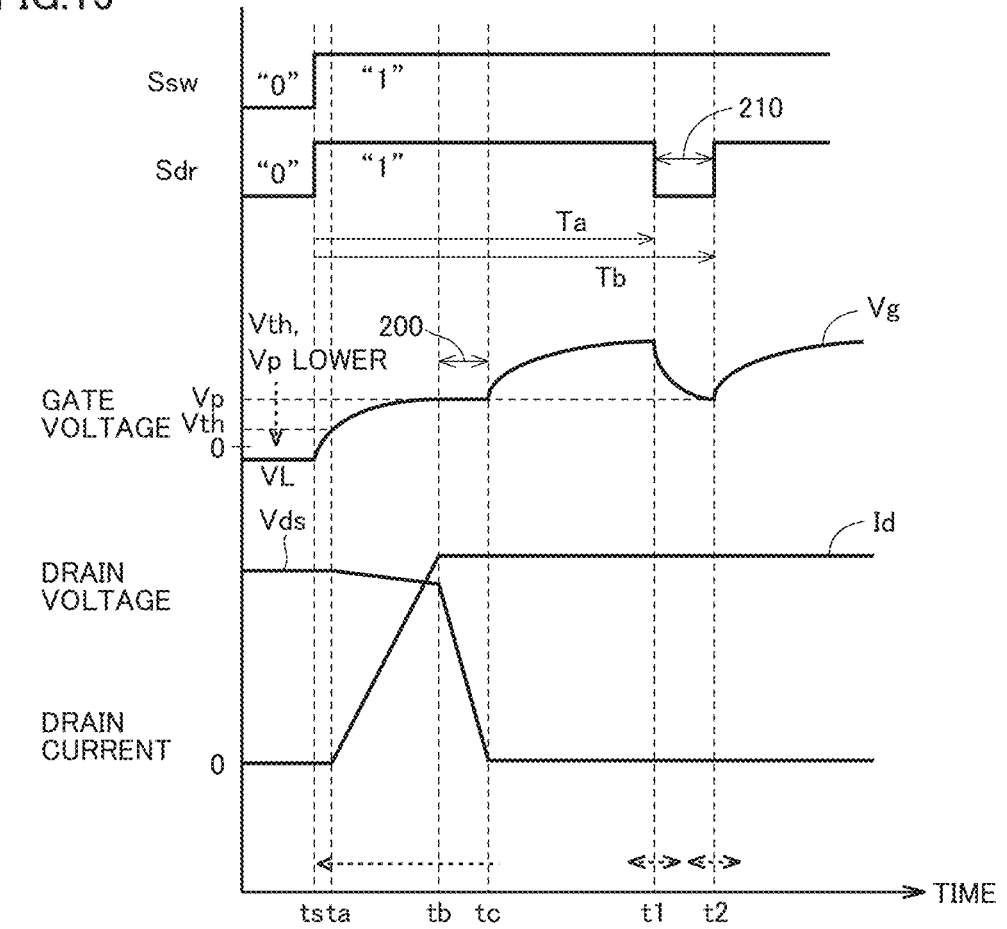
FIG. 15 is an operation waveform diagram showing the variable adjustment of the dropping period when a device temperature in the driving device according to the second embodiment is used as the information quantity.

FIG. 15 is an operation waveform diagram showing the variable adjustment of the drop period with device temperature Tj set as information quantity ST. In FIG. 15, dotted lines indicate the influence on the switching operation of semiconductor device when device temperature Tj rises.

As shown in FIG. 15, when device temperature Tj rises, threshold voltage Vth of semiconductor device 10 decreases. Further, since Miller voltage Vp also changes in conjunction with threshold voltage Vth, Miller voltage Vp also drops as the device temperature rises.

As a result, time ta (the timing at which Vg=Vth is satisfied) in FIG. 15, time tb (the starting timing of Miller period 200), and time tc (the end timing of Miller period 200) are earlier as device temperature Tj rises. As a result, it is understood that when device temperature Tj rises, the occurrence timing of Miller period 200 is earlier, and the drop amount of gate voltage Vg which is allowed in voltage drop period 210 increases.

Therefore, with respect to voltage drop period 210, time lengths Ta and Tb are corrected such that when device temperature Tj rises, the start timing is advanced (time length Ta is reduced) and/or the period length is increased (Tb−Ta is increased), whereby it is possible to optimize at least one of the start timing and the time length of voltage drop period 210 in accordance with the actual switching operation of semiconductor device 10.

When device temperature Tj of semiconductor device 10 is used as information quantity ST, the control processing applied to the flowchart of FIG. 12 can also be applied. At this time, in S120, driving device 101 can extract, for example, device temperature Tj at the time when the turn-on command of semiconductor device 10 is issued (time ts), and determine information quantity ST to be used for the variable adjustment of voltage drop period 210.

In this way, it is also possible to appropriately variably adjust at least one of the start timing and the time length of voltage drop period 210 by the feedback of device temperature Tj of semiconductor device 10.

As a fourth example, it is also possible to adjust voltage drop period 211 by feedback of gate voltage Vg of semiconductor device 10 as information quantity ST.

Figure 16:
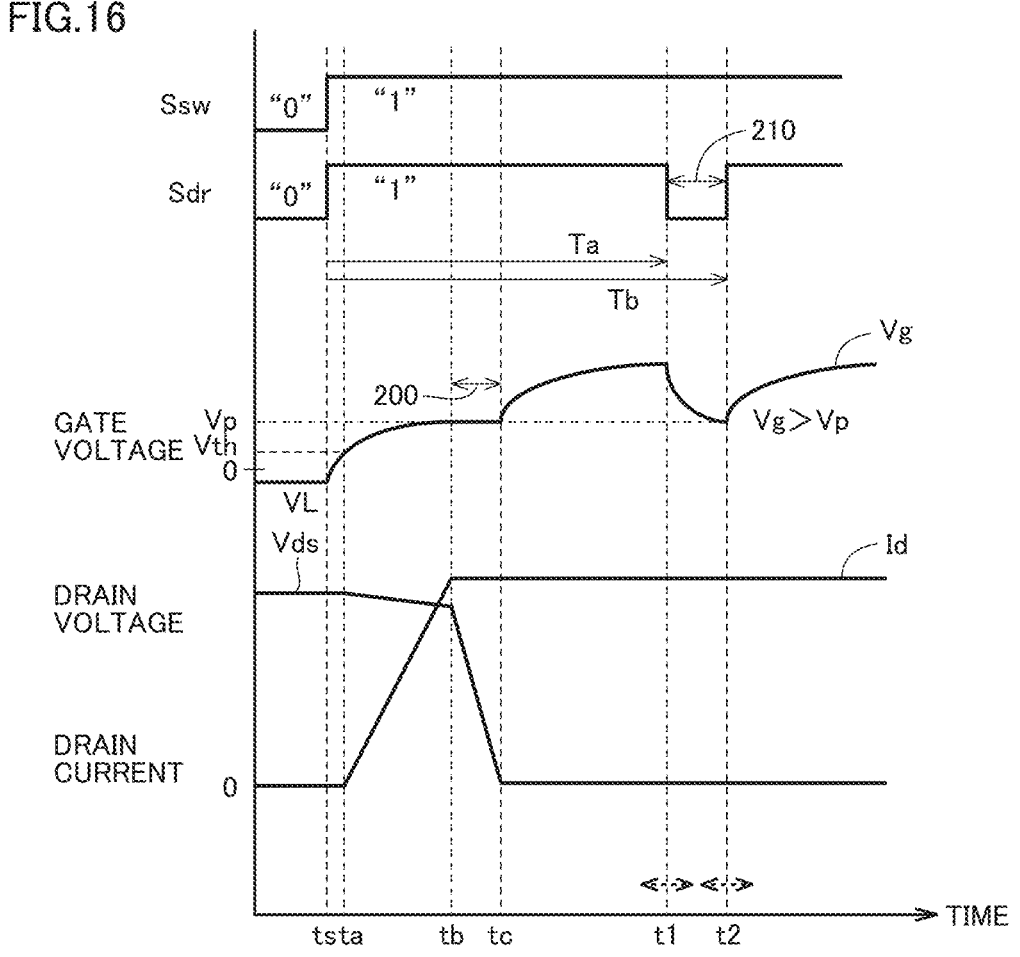
FIG. 16 is an operation waveform diagram showing the variable adjustment of the dropping period when a gate voltage in the driving device according to the second embodiment is used as the information quantity.

FIG. 16 is an operation waveform diagram showing the variable adjustment of the drop period with gate voltage Vg set as information quantity ST.

When gate voltage Vg is fed back as information quantity ST, it is possible to directly detect Miller voltage Vp. Furthermore, by detecting a certain period of gate voltage Vg, it is also possible to detect the start timing (time tb) and the end timing (time tc) of Miller period 200. This makes it possible to appropriately set the start timing of voltage drop period 210 in association with detection of the end timing of Miller period 200.

Furthermore, the feedback of gate voltage Vg during voltage drop period 210 makes it possible to surely prevent gate voltage Vg from dropping up to Miller voltage Vp, and thus terminate voltage drop period 210.

Figure 17:
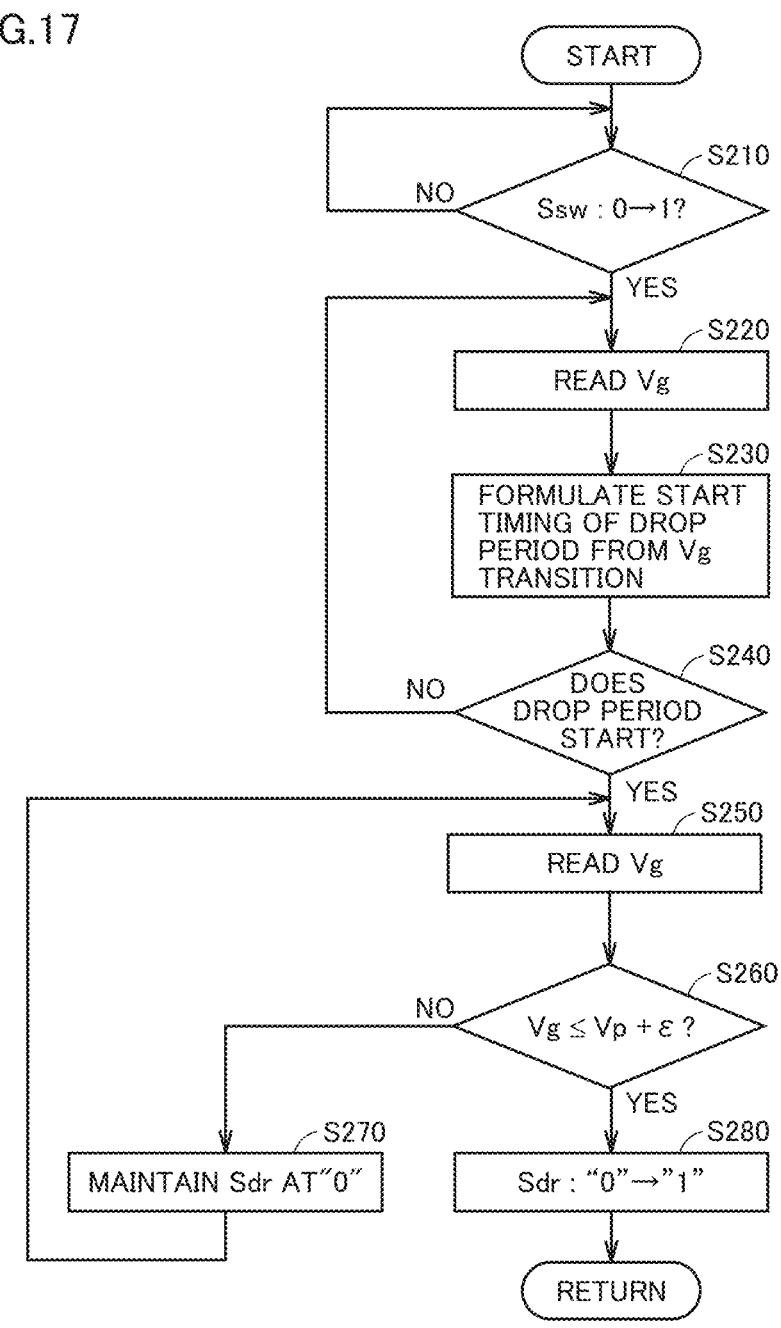
FIG. 17 is a second flowchart showing control processing for the variable adjustment of the dropping period based on the information quantity of an operation state of the semiconductor device in the driving device according to the second embodiment.

FIG. 17 is a second flowchart showing control processing for the variable adjustment of the drop period in driving device 101 according to the second embodiment. FIG. 17 also shows control processing when gate voltage Vg is fed back as information quantity ST as described above.

Referring to FIG. 17, driving device 101 detects transition of drive control signal Ssw from "0" to "1", that is, a turn-on command to semiconductor device 10 in S210 similar to S110 in FIG. 5.

When detecting the turn-on command (when YES determination is made in S210), driving device 101 executes the processing of S220 and S230. In S220, driving device 101 reads in gate voltage Vg by acquiring the detection value of detector 18 in a constant cycle, and in S230, driving device 101 formulates the start timing of voltage drop period 210 by monitoring the transition of read-in gate voltage Vg. For example, it is possible to determine the start timing (time t1) of voltage drop period 210 from the optimal value of the preset time length from the end of Miller period 200 to the start of voltage drop period 210 (time tc to time t1) and the start timing (time tc) of Miller period 200 detected from the transition of gate voltage Vg. At the start timing of voltage drop period 210, drive signal Sdr is changed from "1" to "O" in driving device 101.

The processing of S220 and S230 is repeatedly executed until voltage drop period 210 is started (NO determination is made in S240). When voltage drop period 210 is started (YES determination is made in S240), driving device 101 executes the processing of S240 to S280 for determining the end timing of voltage drop period 210.

In S250, driving device 101 reads in gate voltage Vg as in S220, and compares gate voltage Vg read in S250 with the sum of Miller voltage Vp and a margin value & in S260. Mirror voltage Vp can be obtained in advance from the transition of gate voltage Vg monitored in S230 before YES determination has been made in S240.

Until gate voltage Vg is equal to $Vp+\xi$ or less (NO determination is made in S260), drive signal Sdr is maintained at "0" in S270, and the processing of S250 and S260 is repeatedly executed.

On the other hand, when gate voltage Vg drops up to Vp+ε or less (YES determination is made in S260), driving device 101 changes drive signal Sdr from "0" to "1" in S280, so that voltage drop period 210 is ended.

In this way, it is also possible to optimally variably adjust the start timing and the time length of voltage drop period 210 by setting the start timing and the end timing of voltage drop period 210 based on the fed-back transition of gate voltage Vg of semiconductor device 10.

As described above, according to the driving device of the second embodiment, the feedback of the information quantity regarding the operating state of semiconductor device 10 makes it possible to appropriately set at least one of the start timing and the time length of voltage drop period 210 in accordance with the actual state of semiconductor device 10 which changes depending on the characteristic variation of semiconductor device 10 and the operating environment such as temperature. This enhances the effect of extending the time required until the incurred loss in semiconductor device 10 under the abnormal state exceeds the breakdown energy of semiconductor device 10, and makes it possible to further reduce the possibility that semiconductor device 10 has been broken down.

At least one of above-described gate voltage Vg, gate current, drain voltage Vds, drain current Id, and temperature Tj can be used as information quantity ST to be fed back, and a plurality of information quantities ST can be fed back. For example, by predetermining the optimal values of time lengths Ta and Tb for a combination of a plurality of information quantities ST and storing them in memory 135, whereby it is possible to variably adjust voltage drop period 210 according to the control processing shown in the flowchart of FIG. 12.

Alternatively, it is also possible to variably adjust voltage drop period 210 by a combination in which the start timing of voltage drop period 210 is determined by the control processing in FIG. 12 while the end timing of voltage drop period 210 is determined by the processing of S250 to S280 in FIG. 17.

In the second embodiment, as in the modification of the first embodiment, voltage drop period 210 can be configured by two or more divided drop periods. In this case as well, it is possible to adjust the start and end timings of each divided drop period by the feedback of the information quantity regarding the operating state of semiconductor device 10.

Third Embodiment

In a third embodiment, switching control in a turn-off operation will be described. If the semiconductor device is turned off in the abnormal state in which an overcurrent occurs due to a load short-circuit or the like, there is a concern that the semiconductor device would be broken down due to occurrence of an excessive surge voltage.

Figure 18:
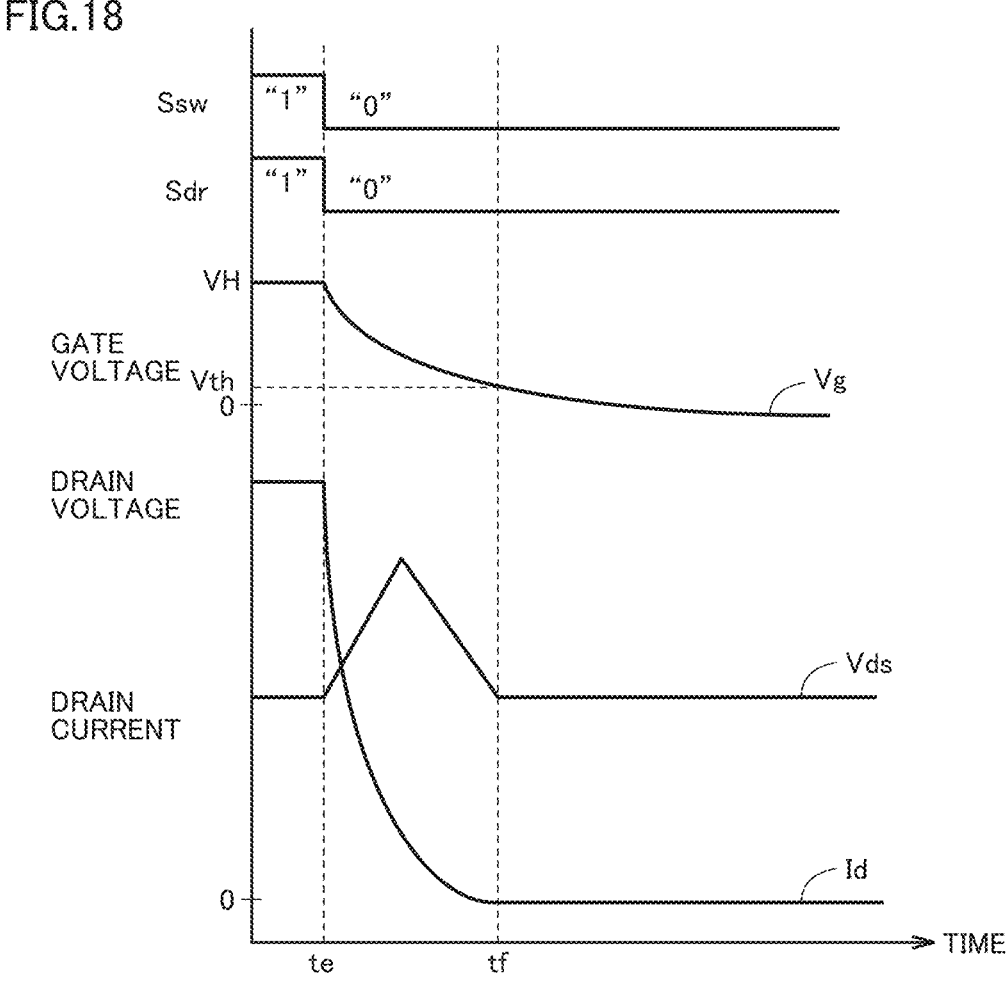
FIG. 18 is a general operation waveform diagram of a turn-off operation under the abnormal state of the semiconductor device.

FIG. 18 shows a general operating waveform diagram in the turn-on operation in the abnormal state of the semiconductor device. In an example of FIG. 18, an operation waveform when semiconductor device 10 (ON-state) contained in a short-circuit path is turned off is shown as a case where the surge voltage is the largest.

Referring to FIG. 18, before time te, semiconductor device 10 is in an ON state in which the main electrodes (drain-source) are conducted to each other. However, when a short-circuit current as described above flows, drain current Id before the turn-off operation is a finite value which conforms to the characteristic relationship shown in FIG. 4 and corresponds to gate voltage Vg (that is, ON-voltage VH). As for drain voltage Vds, the turn-off operation starts from Vds=0 in the normal state, but the turn-off operation starts from Vds=(Vdd−Vss) when a short-circuit current flows.

At time te, driving device 100 starts to discharge gate 15 in response to the change of drive control signal Ssw from "1" to "0". In other words, the turn-off operation starts at time te. For example, during the period of Ssw="0", gate 15 is connected to the power supply node for supplying OFF-voltage VL (in this case, negative voltage). As a result, the gate voltage begins to drop at time te. At time tf, gate voltage Vg drops up to threshold voltage Vth, and Vg<Vth is satisfied after time tf.

In the short-circuit state shown in FIG. 18, there occurs no Miller period in which gate voltage Vg is kept to a constant value as in the turn-on operation described with reference to FIG. 3. On the other hand, although not shown, in the turn-off operation under the normal state, following occurrence of the same Miller period as that in the turn-on operation shown in FIG. 2, gate voltage Vg drops from ON-voltage VH to OFF-voltage VL. In the turn-off operation, gate voltage Vg during the Miller period is kept to Miller voltage Vp common to the turn-on operation.

After time te, following the drop of gate voltage Vg, drain current Id decreases. After time tf at which Vg<Vth is satisfied, drain current Id is equal to 0 (Id=0), and semiconductor device 10 is set to the OFF-state.

At this time, a surge voltage proportional to the reduction rate (dId/dt) of drain current Id is superimposed on drain voltage Vds. If the surge voltage causes drain voltage Vds to exceed a withstand voltage, semiconductor device 10 would be broken down. Therefore, in order to reduce the possibility of damage to semiconductor device 10 under the abnormal state, it is required that at least drain voltage Vds on which the surge voltage is superimposed is restricted to the withstand voltage or less in the turn-off operation from the short-circuit state.

In order to restrict the surge voltage, it is more advantageous that the switching speed is lower, that is, the reduction of the gate voltage is slower, for decreasing the reduction rate of drain current Id. On the other hand, as in the turn-on operation, if the switching speed of semiconductor device 10 is lowered, the incurred loss in the turn-off operation under the normal state increases. As described above, in the turn-off operation, the increase of the switching speed of semiconductor device 10 reduces the incurred loss under a normal state, but increases the possibility of damage to semiconductor device 10 under the abnormal state involving occurrence of an overcurrent. In the third embodiment, switching control in the turn-off operation for improving such a trade-off will be described.

Figure 19:
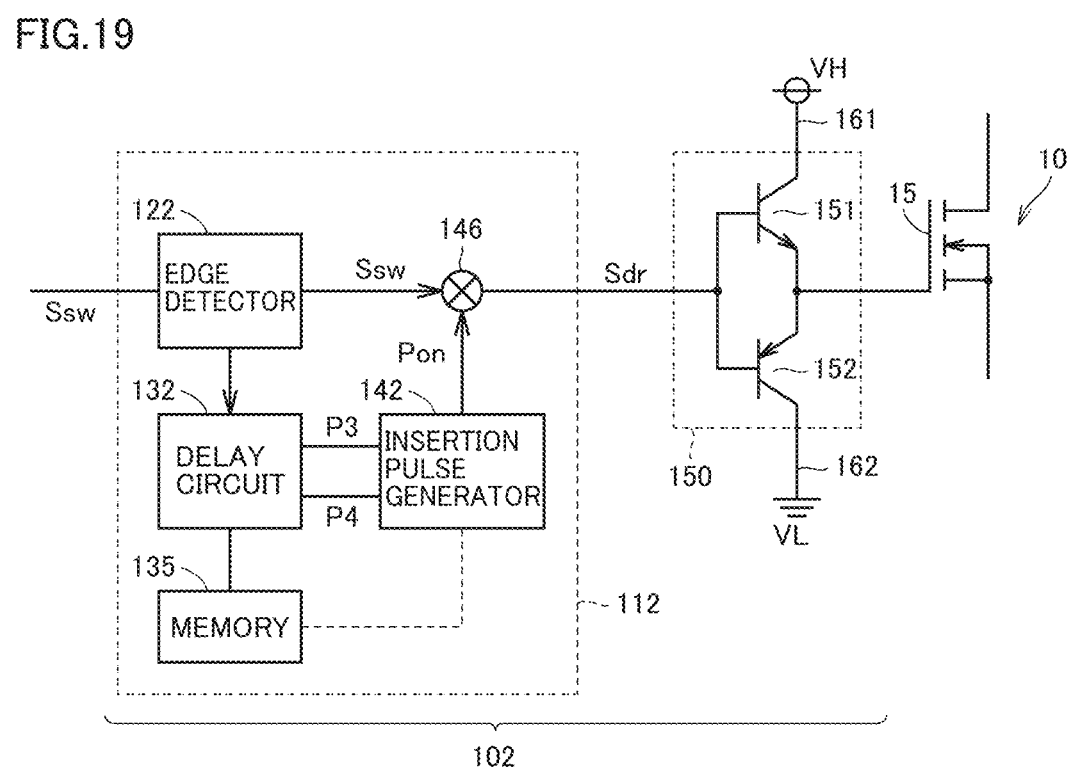
Figure 20:
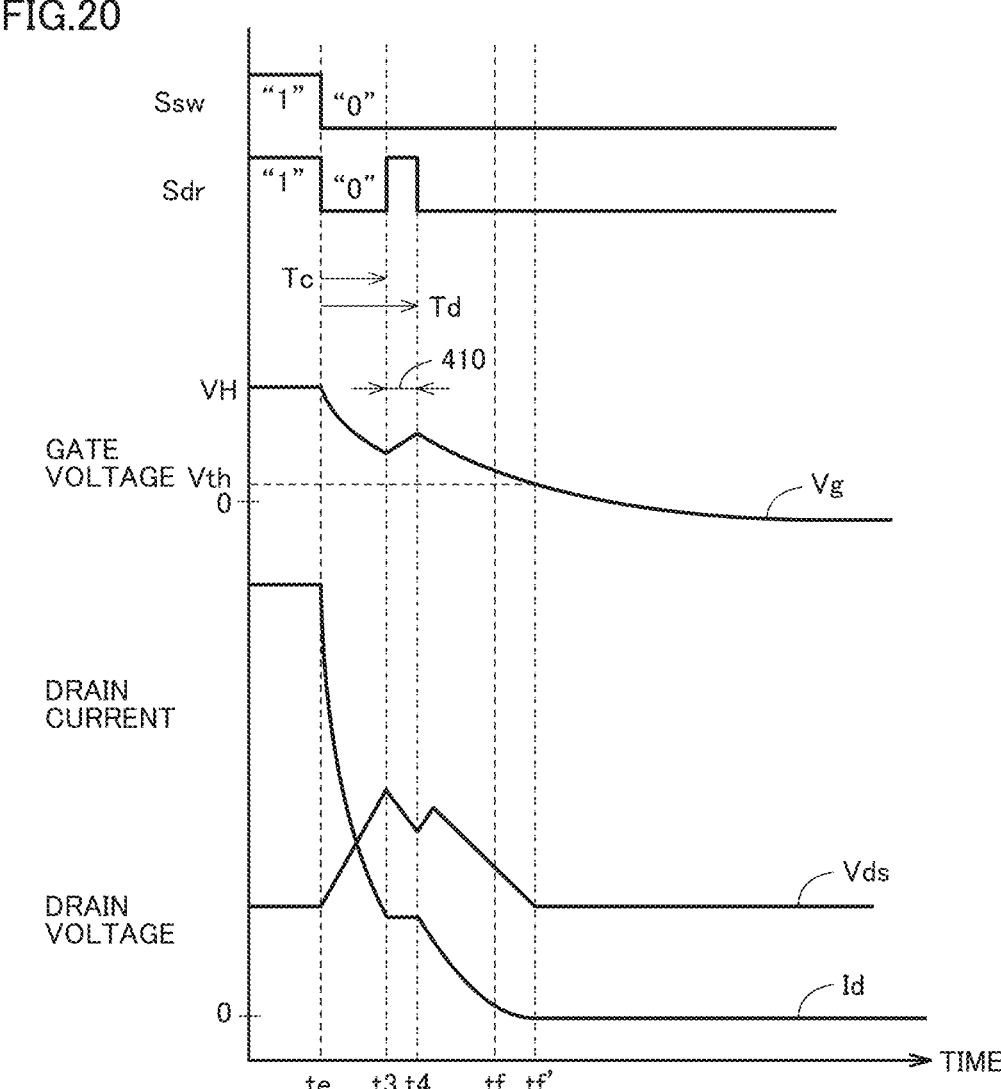
FIG. 20 is an operation waveform diagram under an abnormal state of a semiconductor device which is turned off by the driving device according to the third embodiment.

FIG. 19 is a block diagram showing a configuration example of a driving device 102 according to the third embodiment. FIG. 20 shows an operation waveform diagram of a turn-on operation in the abnormal state (short-circuit state) of a semiconductor device to be subjected to ON/OFF-control by driving device 102 according to the third embodiment.

With reference to FIG. 19, driving device 102 includes a drive adjuster 112 and drive circuit 150.

As can be understood from the comparison between FIG. 20 and FIG. 18, driving device 102 according to the third embodiment drives semiconductor device 10 such that in the turn-off operation in which drive control signal Ssw transits from "1" to "0", drive control signal Ssw is kept at "0", and a voltage rising period 410 in which drive signal Sdr is set to "1" is provided. As shown in FIG. 20, in voltage rising period 410, semiconductor device 10 is driven such that gate voltage Vg turns to rising.

As shown in FIG. 19, drive adjuster 112 generates drive signal Sdr provided with voltage rising period 410 (FIG. 20) described above based on drive control signal Ssw. Drive adjuster 112 includes an edge detector 122, a delay circuit 132, a memory 135, an insertion pulse generator 142, and a signal synthesizer 146. The function of each component of drive adjuster 112 may also be implemented by a dedicated electronic circuit (hardware) or by program processing (software).

Memory 135 is configured to store time lengths Tc and Td that respectively define the start timing and the end timing of voltage rising period 410 in FIG. 20. In other words, the relationship of Td>Tc is established between Tc and Td. Memory 135 can be configured to store time lengths Tc and Td described above in common with the time lengths defining the start timing and the end timing of voltage drop period 210 during the turn-on operation in the first embodiment and the modification thereof.

When drive control signal Ssw changes from "1" to "0" at time te, edge detector 122 detects a turn-off command and generates a one-shot pulse. In other words, time te corresponds to a turn-off start timing. The one-shot pulse from edge detector 122 is input to delay circuit 132. Further, edge detector 122 transmits drive control signal Ssw to signal synthesizer 146.

Delay circuit 132 generates a third pulse P3 obtained by delaying the one-shot pulse from edge detector 120 by Tc and a fourth pulse P4 obtained by delaying the one-shot pulse from edge detector 120 by Td, and inserts them into insertion pulse generator 142.

Insertion pulse generator 142 can detect the start timing and the end timing of voltage rising period 410 from third pulse P3 and fourth pulse P4. For example, in the turn-off operation, insertion pulse generator 142 generates an ON-pulse signal Pon which is set to "1" from the reception time of third pulse P3 until the reception time of fourth pulse P4, and set to "0" in other periods.

Signal synthesizer 146 generates drive signal Sdr by performing a logical sum (OR) operation on drive control signal Ssw and ON-pulse signal Pon from insertion pulse generator 142. As a result, as shown in FIG. 20, within the period in which drive control signal Ssw is set to "0", drive signal Sdr is set to "1" from time t3 until time t4, and is set to "0" in other periods. Accordingly, voltage rising period 410 is provided in drive signal Sdr. Drive circuit 150 has a configuration similar to that described in the first embodiment (FIG. 5), and discharges gate 15 in the period when drive signal Sdr is set to "0", while charging gate 15 in the period when drive signal Sdr is set to "1".

The time length of voltage rising period 410, that is, (Td−Tc) is set such that a period in which gate voltage Vg turns to rising occurs. Note that time t3 corresponds to the timing when time length Tc has elapsed since time te at which the turn-off operation is started, and time t4 corresponds to the timing when time length Td has elapsed since time te.

As can be understood from the comparison between FIGS. 20 and 18, gate voltage Vg temporarily turns to rising in voltage rising period 410 provided from time t3 to time t4. As described above, since drain current Id in the short-circuit state depends on gate voltage Vg, the reduction rate of drain current Id is relaxed due to rising of gate voltage Vg in voltage rising period 410. This causes the surge voltage to decrease, so that drain voltage Vds once turns to decreasing in the middle of the rising period in FIG. 18.

As a result, it is possible to restrict the maximum value of drain voltage Vds. As a result, it is possible to reduce the possibility that semiconductor device 10 is damaged when the drain voltage Vds on which the surge voltage is superimposed exceeds the withstand voltage in the turn-off operation from the short-circuit state.

As can be understood from the behavior of drain voltage Vds shown in FIGS. 18 and 20, voltage rising period 410 is required to be provided in the middle of a period in which the surge voltage rises, that is, a period in which drain current Id is reduced (a period until drain current ID decreases to 0), and it is preferable that voltage rising period 410 is provided at a relatively early timing during the turn-off operation. Therefore, unlike voltage drop period 210 in the turn-on operation, it is assumed that voltage rising period 410 in the turn-off operation is provided at an earlier timing than Miller period 200 in the turn-off operation under the normal state with time te set as a starting point.

In FIG. 20, by providing voltage rising period 410, the timing at which gate voltage Vg drops up to threshold voltage Vth is a time tf which is later than time tf which is the same as that in FIG. 18. The delay time from time tf to time tf, that is, the amount of increase in the required time until the turn-off operation is completed depends on the time length of voltage rising period 410.

As a result, there is a concern that the incurred loss in the turn-off operation, including the turn-off operation in the normal state, increases due to the influence of the delay time. However, the time length of voltage rising period 410 can be set to be as short as possible within a range in which the rise of drain voltage Vds can be temporarily stopped by the rise of gate voltage Vg. Therefore, by minimizing the delay time, it is possible to restrict an increase in the incurred loss caused by applying voltage rise period 410. At least, as compared with the case where the switching speed is lowered, that is, the discharge rate of gate 15 by drive circuit 150 is lowered throughout the turn-off operation in order to lower the reduction rate of drain current Id, it can be understood that the increase amount of the incurred loss that is traded with the effect of restricting the surface voltage is greatly reduced.

As described above, according to driving device 102 of the third embodiment, short-pulse-shaped voltage rising period 410 is provided in the turn-off operation of semiconductor device 10, whereby it is possible to reduce the possibility that semiconductor device 10 is damaged by restricting the surge voltage in the abnormal state involving occurrence of an overcurrent while restraining increase of the incurred loss in the normal state. As a result, even in the turn-off operation, the switching of the semiconductor device can also be controlled such that the possibility of damage in the overcurrent abnormal state is reduced while the influence on the switching loss in the normal state has been restrained.

The behavior of the turn-off operation of semiconductor device 10 also differs according to the characteristics of semiconductor device 10. Therefore, with respect to the optimal values of the position and the time length (that is, the start timing and the end timing) of voltage rising period 410, it is preferable to obtain the optimal values in advance by an actual machine test or simulation using semiconductor device 10 to be subjected to switching control by driving device 102. By setting time lengths Tb and Tc to be prestored in memory 135 in association with the optimal values obtained in advance, it is possible to provide voltage rising period 410 at appropriate position and with the time length in order to implement the effect according to the above-described third embodiment.

In the third embodiment, the divisional setting of voltage drop period 210 in the modification of the first embodiment can be similarly applied to voltage rising period 410. In other words, voltage rising period 410 can also be divided at arbitrary multiple times, and set.

Fourth Embodiment

A fourth embodiment describes a technique for variably setting voltage rising period 410 by using an information quantity regarding the operating state of semiconductor device 10 (at least one of gate voltage Vg, the gate current, drain voltage Vds, drain current Id, and device temperature Tj) which is similar to that of the second embodiment.

Figure 21:
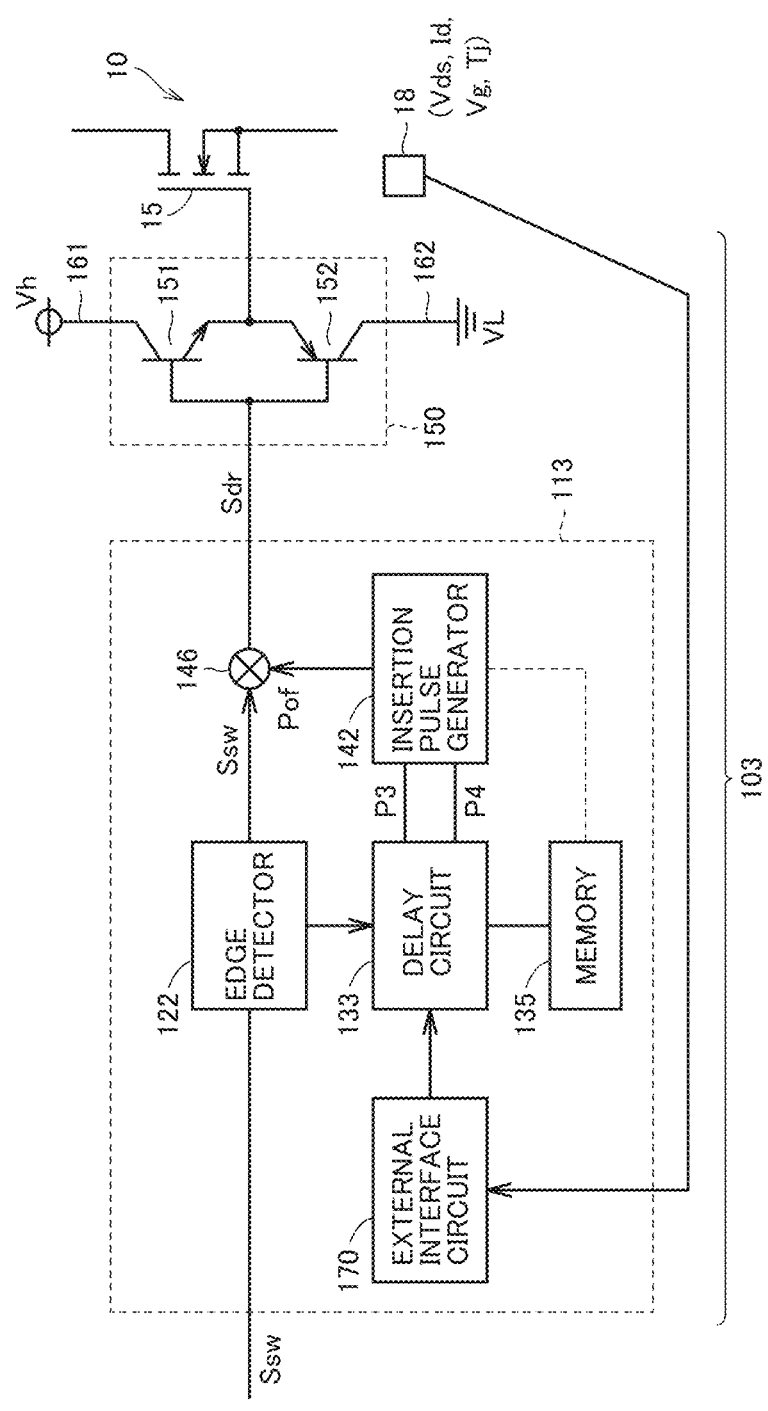
FIG. 21 is a block diagram showing a configuration example of a driving device according to a fourth embodiment.

FIG. 21 is a block diagram showing a configuration example of a driving device 103 according to the fourth embodiment.

As shown in FIG. 21, as compared with the configuration of driving device 102 (FIG. 19) according to the third embodiment, driving device 103 according to the fourth embodiment differs in that driving device 103 includes a drive adjuster 113 in place of drive adjuster 112. Drive adjuster 113 differs from drive adjuster 112 in that an external interface circuit 170 is added.

Similarly to FIG. 9, a detection value (detector 18) of at least one of gate voltage Vg, the gate current, drain voltage Vds, drain current Id, and temperature Tj which are information quantities ST regarding the operating state of semiconductor device 10 is input to external interface circuit 170. The functions of edge detector 122, insertion pulse generator 142, and signal synthesizer 146 in drive adjuster 112 are the same as those in the third embodiment, and thus detailed description thereof is not be repeated.

In driving device 103 according to the fourth embodiment, drive adjuster 112 includes a delay circuit 133 instead of delay circuit 132 (FIG. 5) in the third embodiment. Delay circuit 133 acquires the value of information quantity ST via external interface circuit 170. Further, Delay circuit 133 has a function of variably adjusting at least one of the start timing and the time length of voltage rising period 410 according to information quantity ST. For example, delay circuit 133 is configured to generate third pulse P3 and fourth pulse P4 in such a manner that at least one of time lengths Tc and Td defining voltage rising period 410 is corrected according to information quantity ST.

Insertion pulse generator 142 generates ON-pulse signal Pon by using third pulse P3 and fourth pulse P4 from delay circuit 133, whereby at least one of the start timing and the time length of voltage rising period 410 to be provided in the turn-off operation can be variably adjusted according to information quantity ST in driving device 103, similarly to voltage drop period 210 (second embodiment) in the turn-on operation.

In semiconductor device 10, as drain voltage Vds before the start of turn-off (before time te) is higher, the time length between time te and time tf in FIG. 20 is longer, and the time required for the turn-off operation is longer. Likewise, with respect to drain current Id, as drain current Id before the start of turn-off (before the time te) is larger, the time required for the turn-off operation of semiconductor device (the time length between time te and time tf) is longer.

Therefore, when drain voltage Vds and drain current Id before the start of turn-off (before time te) are taken as information quantities ST, it is possible to adjust at least one of time lengths Tc and Td such that as drain voltage Vds is higher or as drain current Id is larger, the start timing of voltage rising period 410 is set to be earlier, and/or the period length of voltage rising period 410 is set to be longer.

Further, as described with reference to FIG. 4 and the like, since there is a relationship between gate voltage Vg and drain current Id in the short-circuited state, gate voltage Vg before the start of turn-off (before time te) can be used as information quantity ST. As shown in FIG. 4, as gate voltage Vg is higher, drain current Id is larger. Therefore, it is possible to adjust at least one of time lengths Tc and Td such that as gate voltage Vg at the start of turn-off (time te) is higher, the start timing of voltage rising period 410 is set to be earlier, and/or the period length of voltage rising period 410 is set to be longer.

As described in the second embodiment, threshold voltage Vth of semiconductor device 10 decreases as device temperature Tj increases. Therefore, as device temperature Tj is lower, the time required for the turn-off operation of semiconductor device 10 (the time length from time te to time tf in FIG. 20) is longer. Therefore, at least one of time lengths Tc and Td can be adjusted such that as device temperature Tj at the start of turn-off (time te) is lower, the start timing of voltage rising period 410 is set to be earlier and/or voltage rising period 410 is set to be longer.

Figure 22:
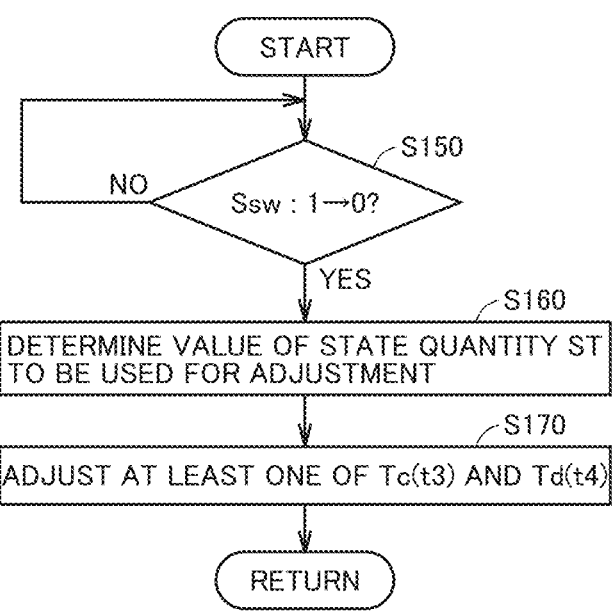
FIG. 22 is a flowchart showing control processing for variable adjustment of a rising period based on an information quantity of an operation state of a semiconductor device in the driving device according to the fourth embodiment.

FIG. 22 is a flowchart showing control processing for the variable adjustment of the rising period based on the information quantity of the operating state of the semiconductor device in the driving device according to the fourth embodiment. Separately from the processing according to the flowchart shown in FIG. 22, driving device 101 can acquire the detection value by detector 18, that is, the information quantity regarding the operating state of the semiconductor device via external interface circuit 170 in a constant cycle.

Referring to FIG. 22, driving device 103 detects a transition of drive control signal Ssw from "1" to "0", that is, a turn-off command to semiconductor device 10 in S150. The processing of S150 is equivalent to the function of edge detector 122.

When detecting the turn-off command (when YES determination is made in S150), driving device 103 executes the processing of S160 and S170. On the other hand, even if the turn-off operation is completed once and thus the processing is returned to "START", the processing of S160 and subsequent steps is not executed until the turn-off command is detected (NO determination is made in S150).

In S160, driving device 103 extracts the value of information quantity ST to be used for the variable adjustment of voltage rising period 410 from information quantity ST acquired in a constant cycle. For example, as described above, the value of information quantity ST to be used for the adjustment can be determined by extracting a detection value obtained at the start timing (time te) of the turn-off command or at a predetermined timing which is contained before the start of the turn-off.

In S170, driving device 103 adjusts at least one of time length Ta defining time t3 (the start timing of voltage rising period 410) and time length Tb defining time t4 (the end timing of voltage rising period 410) based on the value of information quantity ST determined in S160.

The processing of S170 can be executed in the same manner as S130 of the second embodiment (FIG. 12). In other words, typically, it can be implemented by pre-storing, in memory 135 a lookup table or a functional expression for determining the optimal values of time lengths Tc and Td for information quantity ST. Optimal values of time lengths Tc and Td in the turn-off operation can also be obtained in advance by an actual machine test or simulation of the switching operation of semiconductor device 10 under the condition that information quantity ST is changed.

In S170, it is also possible to adjust at least one of time lengths Tc and Td by feedback of a plurality of information quantities ST. In this case, it is necessary to predetermine the optimal values of time lengths Tc and Td for combinations of a plurality of information quantities ST.

In this way, by executing the processing of S160 and S170 for each turn-off command of semiconductor device 10, it is possible to appropriately variably adjust at least one of the start timing and the time length of voltage rising period 410 by feedback of the information quantity regarding the operating state of semiconductor device 10 (at least one of gate voltage Vg, the gate current, drain voltage Vds, drain current Id, and device temperature Tj).

As a result, according to the driving device according to the fourth embodiment, the feedback of the information quantity regarding the operating state of semiconductor device 10 makes it possible to appropriately set at least one of the start timing and the time length of voltage rising period 410 in accordance with the actual switching operation that changes depending on the characteristic variation of semiconductor device 10 and the operating environment such as temperature. As a result, the effect of restricting the surge voltage can be enhanced, and thus the possibility that semiconductor device 10 may be broken down can be further reduced.

Here, unlike the turn-on operation, in the turn-off operation, it is possible to distinguish between the start of the turn-off operation under the normal state and the turn-off operation under the abnormal state in which an overcurrent occurs based on information quantity ST of semiconductor device 10 before the start of the turn-off operation (ON-state) at the time point when the turn-off command is detected. Further, as described above, voltage rise period 410 is not necessarily located after the end of Miller period 200, and thus there is a concern that it may have some effect on the switching loss (incurred loss) in the normal state.

Figure 23:
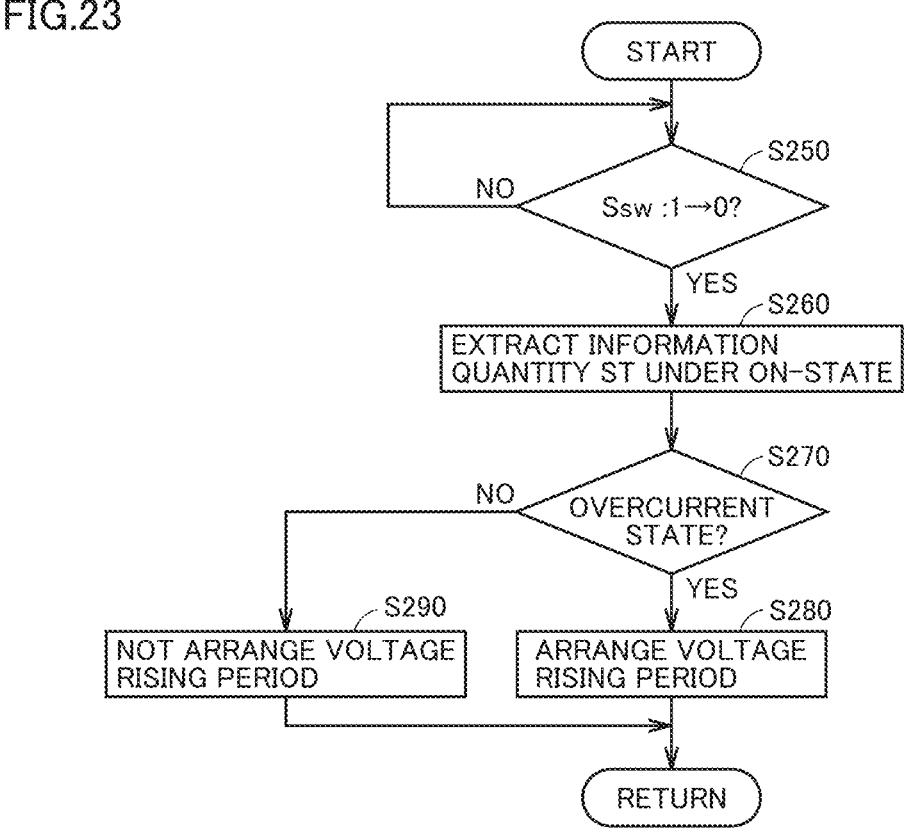
FIG. 23 is a flowchart showing control processing for selecting arrangement of a voltage rising period in the driving device according to the fourth embodiment.

FIG. 23 is a flowchart showing control processing for selecting the arrangement of the voltage rising period in the turn-off operation by driving device 103 according to the fourth embodiment.

Referring to FIG. 23, driving device 103 detects transition of drive control signal Ssw from "1" to "0", that is, a turn-off command to semiconductor device 10 in S250 similar to S160 in FIG. 22. As described above, separately from the processing according to the flowchart shown in FIG. 23, driving device 103 also acquires the information quantity regarding the operating state of semiconductor device 10 via external interface circuit 170 in a constant cycle even during the ON-state period of semiconductor device 10.

When detecting the turn-off command (when YES determination is made in S250), driving device 103 executes the processing of S260 and S270. In S260, driving device 103 extracts information quantity ST to be used for detection determination of the overcurrent state in S270 from the detection value of detector 18 which was read in under the ON-state of semiconductor device 10. For example, in S260, the instantaneous value of a current or a voltage such as drain current Id or drain voltage Vds at or before the detection time point of the turn-off command (time te), or an average value, a maximum value, or the like in a constant cycle is extracted.

In S270, by comparing information quantity ST extracted in S170 with a predetermined determination value, drive device 103 determines whether semiconductor device 10 before turn-off is in an overcurrent state. Typically, the overcurrent state can be detected when drain current Id is larger than a determination value.

When the overcurrent state is detected (when YES determination is made in S270), driving device 103 arranges voltage rising period 410 in the turn-off operation in S280. In S280, as the case of the third embodiment, voltage rising period 410 can be fixedly set by using predetermined time lengths Tc and Td. Alternatively, in S280, by further executing S160 and S170 of FIG. 22, it is possible to variably set time lengths Tc and Td by feedback of information quantity ST (at least one of gate voltage Vg, the gate current, drain voltage Vds, drain current Id, and device temperature Tj).

On the other hand, when the overcurrent state is not detected (when NO determination is made in S270), driving device 103 performs the turn-off operation without arranging voltage rising period 410 in S290. In this case, in FIG. 20, drive signal Sdr is maintained at "0" after time te until a next turn-on command is generated.

In driving device 103 according to the fourth embodiment, by applying the control shown in FIG. 23, it is possible to restrict the surge voltage in the turn-off operation under the abnormal state involving occurrence of an overcurrent state without increasing the incurred loss in the turn-off operation under the normal state in which no overcurrent state occurs. In particular, the start point timing and the time length of voltage rising period 410 can be set specifically for restriction of the surge voltage under the abnormal state without considering an increase in steady-state loss in a normal state, so that the effect of restricting the surge voltage can be expected to be enhanced. This can further reduce the possibility that semiconductor device 10 will be broken down.

Further, in the fourth embodiment, voltage rising period 410 can be divided into any number of multiple times. As a result, it can be expected that the effect of restricting the surge voltage under the abnormal state is further enhanced.

In driving devices 100 to 103 described in the first to fourth embodiments, as described with reference to FIGS. 5 and 19, etc., the voltage to be applied to gate 15 during voltage drop period 210 and OFF-voltage VL of semiconductor device 10 are made common, and the voltage to be applied to gate 15 during voltage rising period 410 and ON-voltage VH of semiconductor device 10 are made common. This enables voltage drop period 210 and/or voltage rising period 410 to be provided without increasing the number of stages in the voltage level to be applied to gate 15 by driving devices 100 to 103. As a result, complication of the circuit configuration can be avoided.

Conversely, in each of voltage drop period 210 and voltage rising period 410, even if voltages different from ON-voltage VH and OFF-voltage VL are applied to gate 15, it is possible to obtain the same effect as described in the embodiments insofar as gate voltage Vg drops in voltage drop period 210 and/or gate voltage Vg rises in voltage rising period 410. However, if a configuration increasing the number of stages in voltage level as described above is adopted, there is a concern that the configuration of driving devices 100 to 103 including driving circuit 150 would be complicated.

Further, as described above, in driving devices 101 to 103 described in the first to fourth embodiments, each of the functions of drive adjusters 110 to 113 can be configured by either hardware or software. In particular, when all the functions of drive adjusters 110 to 113 are implemented by software, it is also possible to configure drive adjusters by using a part of the function of control circuit 20 shown in FIG. 1.

In this case, the control circuit 20 may directly input drive signal Sdr containing an OFF-pulse corresponding to voltage drop period 210 and/or an ON-pulse corresponding to voltage rising period 410 to drive circuit 150 constituting driving device 100. Even in this case, drive signal Sdr and drive control signal Ssw described in the present embodiments can be identified by comparing the number of times at which the signal level changes with the actual number of times at which semiconductor device 10 is turned on and off.

Note that if all of drive adjusters 110 to 113 are implemented by software, it is possible to facilitate adjustment of the start timing and the time length of voltage drop period 210 and/or voltage rising period 410. In this case, as for the hardware, since drive circuit 150 can be designed specifically for the function of turning on and off semiconductor device 10 at high speed, fine adjustment such as adjustment of the gate resistance is unnecessary, which makes it possible to reduce the design load. In other words, after simplifying the hardware design, the switching of semiconductor device can be controlled by adjustment using software so as to implement both the reduction of the switching loss in the normal state and the reduction of the possibility of damage in the overcurrent abnormal state.

Further, it is possible to control the switching of semiconductor device 10 by combination of driving device 100 or 101 according to the first or second embodiment and driving device 103 or 104 according to the third or fourth embodiment so as to perform both the setting of voltage drop period 210 in the turn-on operation and the setting of voltage rising period 410 in the turn-off operation. For example, such switching control can be implemented by selectively transmitting, to drive circuit 150, drive signal Sdr from drive adjuster 110 or 111 of driving device 100 or 101 and drive signal Sdr from drive adjuster 112 or 113 of driving device 102 or 103 by using a selector or the like which operates according to drive control signal Ssw.

Fifth Embodiment

In a fifth embodiment, a configuration example of a power conversion apparatus to which the driving device of the semiconductor device described in the first to fourth embodiments is applied will be described.

Figure 24:
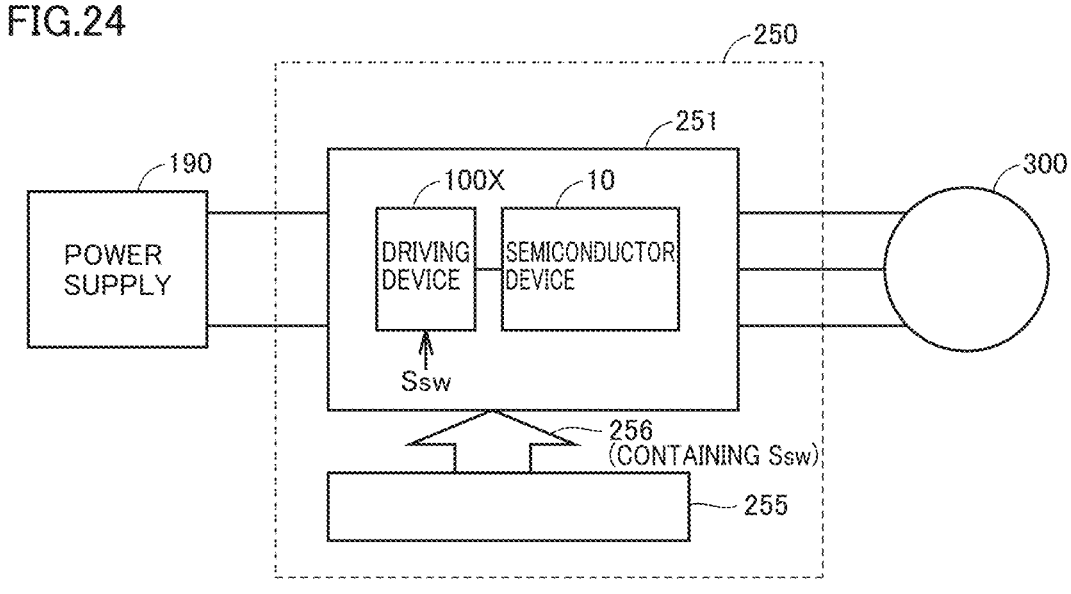
FIG. 24 is a block diagram showing a configuration of a power conversion system to which a power conversion apparatus according to a fifth embodiment is applied.

FIG. 24 is a block diagram showing a configuration of a power conversion system to which a power conversion apparatus according to the fifth embodiment is applied.

Referring to FIG. 24, the power conversion system includes a power supply 190, a power conversion apparatus, 250 and a load 300. Power supply 190 is a DC power supply and supplies DC power to power conversion apparatus 250. Various units may be used to configure power supply 190, and for example, it can be configured by a DC system, a solar battery, or a storage battery. Alternatively, power supply 190 may be configured by a rectifier circuit or an AC/DC converter connected to an AC system. Furthermore, power supply 190 can also be configured by a DC/DC converter that converts DC power output from the DC system into predetermined power.

Load 300 is typically a three-phase electric motor to be driven with AC power supplied from power conversion apparatus 250. Note that load 300 is not limited to a specific application, and it is an electric motor mounted in each electric device. For example, an electric motor for a hybrid vehicle, an electric vehicle, a railroad vehicle, an elevator, or an air conditioner is used as load 300.

Power conversion apparatus 250 is, for example, a three-phase inverter connected between power supply 190 and load 300, converts DC power supplied from power supply 190 into AC power, and supplies the AC power to load 300.

Power conversion apparatus 250 includes a main conversion circuit 251 that converts DC power into AC power and outputs the AC power, and a control circuit 255 that outputs a control signal 256 for controlling main conversion circuit 251 to main conversion circuit 251.

Main conversion circuit 251 includes at least one semiconductor device 10, and a driving device 100X arranged in association with each semiconductor device 10. Driving device 100X comprehensively describes driving devices 101 to 103 described in the present embodiments and the combinations thereof.

Control signal 256 from control circuit 255 includes a drive control signal Ssw for controlling ON/OFF of semiconductor device 10. Each semiconductor device 10 is turned on and off according to each drive control signal Ssw, so that main conversion circuit 251 converts DC power supplied from power supply 190 into AC power, and supplies the AC power to load 300.

Main conversion circuit 251 may have various specific circuit configurations. For example, main conversion circuit is a 2-level three-phase full bridge circuit, and includes six semiconductor devices 10, and six freewheeling diodes which are connected in inverse-parallel to semiconductor devices 10. Six semiconductor devices are connected in series every two semiconductor devices 10 to configure upper and lower arms, and each of upper and lower arms forms each phase (U-phase, V-phase, and W-phase) of the full bridge circuit. Output terminals of the upper and lower arms, that is, three output terminals of main conversion circuit 251 are connected to load 300.

Control circuit 255 controls ON/OFF of semiconductor device 10 of main conversion circuit 251 such that desired power is supplied to load 300. Specifically, based on the power to be supplied to load 300, control circuit 255 calculates a time (ON-time) in which each semiconductor device 10 of main conversion circuit 251 should be brought into an ON-state. For example, main conversion circuit 251 can be controlled according to PWM-control for modulating the ON-time of each semiconductor device 10 according to voltage to be output.

At each time point, control circuit 255 sets drive control signal Ssw of semiconductor device 10 to be brought into ON-state to "1", while setting drive control signal Ssw of semiconductor device 10 to be brought into OFF-state to "0".

Driving device 100X controls the gate voltage of corresponding semiconductor device 10 according to drive control signal Ssw from control circuit 255. As a result, the switching of each semiconductor device 10 can be controlled such that the possibility of damage under the over-current abnormal state is reduced while the influence on the switching loss under the normal state in each semiconductor device 10 has been restrained. As a result, for power conversion apparatus 250, it is possible to implement high power conversion efficiency due to a low switching loss and reduction in the possibility of damage when a short-circuit occurs in load 300 or the like.

Driving device 100X may be incorporated in a semiconductor module (not shown) in which semiconductor device 10 is incorporated, or may be connected to the semiconductor module from the outside thereof.

Further, in the present embodiment, a two-level three-phase inverter has been described as an example of power conversion apparatus 250, but driving device 100 described in the present embodiment can be applied to various power conversion apparatus other than the two-level three-phase inverter. For example, power conversion apparatus 250 may be a three-level or multi-level power conversion apparatus, and when load 300 is a single-phase AC load, power conversion apparatus 250 may be configured by a single-phase inverter. Moreover, when load 300 is a DC load, power conversion apparatus 250 can be configured by a DC/DC converter or an AC/DC converter.

As described above, for any power conversion apparatus that performs power conversion by ON/OFF-control of a semiconductor device, semiconductor device 10 can be turned on and off by the driving devices according to the first embodiment to the fourth embodiment or by driving device 100X based on the combination thereof.

In the fifth embodiment, it is also possible to implement all the functions of drive adjusters 110 to 113 of driving device 100X by software. In this case, control signal 256 from control circuit 255 may be configured to include drive signal Sdr containing the OFF-pulse corresponding to voltage drop period 210 and/or the ON-pulse corresponding to voltage rising period 410. Even in this case, drive signal Sdr and drive control signal Ssw can be discriminated from each other by comparing the number of times at which the signal level changes with the number of times at which semiconductor device 10 is actually turned on and off.

Further, the power conversion apparatus according to the present embodiment is not limited to the case where the above-described load is an electric motor. For example, the power conversion apparatus may be used as a power supply device for an electric discharge machine, a laser processing machine, an induction heating cooker, or a contactless power supply system, and further can also be used as a power conditioner for a solar power generation system, a power storage system or the like.

It should be noted that the embodiments disclosed at this time are illustrative in all respects and not restrictive. The technical scope of the present disclosure is indicated by the scope of claims rather than the above description, and is intended to include all modifications within the meaning and the scope equivalent to the scope of claims.

REFERENCE SIGNS LIST semiconductor device, 11 drain, 12 source, 15 gate, 18 detector, 20, 255 control circuit, 100, 100X, 101, 102, 103 driving device, 110, 111, 112, 113 drive adjuster, 120, 122 edge detector, 130, 131, 132, 133 delay circuit, 135 memory, 140, 142 insertion pulse generator, 145, 146 signal synthesizer, 150 drive circuit, 151, 152 transistor, 161, 162 power supply node, 170 external interface circuit, 190 power supply, 200 Miller period, 210 voltage drop period, 211, 212 divided drop period, 250 power conversion apparatus, 251 main conversion circuit, 256 control signal, 300 load, 410 voltage rising period, Id drain current, P1 to P4 pulse, Pof OFF-pulse signal, Pon ON-pulse signal, Sdr drive signal, Ssw drive control signal, Tj device temperature, VH ON-voltage, VL OFF-voltage, Vds drain voltage (drain-source voltage), Vg gate voltage (gate-source voltage), Vp Miller voltage, Vth threshold voltage.

The invention claimed is:

1. A driving method for a semiconductor device to be turned on and off according to a drive control signal, the driving method comprising:

starting a turn-on operation that charges a gate of the semiconductor device under an OFF-state in response to a turn-on command with a transition of the drive control signal from a first level to a second level;

starting a turn-off operation that discharges the gate of the semiconductor device under an ON-state in response to a turn-off command with a transition of the drive control signal from the second level to the first level; and arranging at least one of a voltage drop period that is provided within a period in which the drive control signal is maintained at the second level after start of the turn-on operation, and a voltage rising period that is provided within a period in which the drive control signal is maintained at the first level after start of the turn-off operation, wherein the voltage drop period is created by a temporary discharge of the gate after end of a Miller period, and the voltage rising period is created by a temporary charge of the gate during a period in which a current of the semiconductor device is decreasing.

2. The driving method for a semiconductor device according to claim 1, wherein:

the arranging includes variably adjusting at least one of a start timing and a time length of the voltage drop period arranged in the turn-on operation according to an information quantity of an operating state of the semiconductor device.

3. The driving method for a semiconductor device according to claim 2, wherein:

the information quantity of the operating state includes at least one of a voltage between main electrodes, a current between the main electrodes, a gate voltage, and a device temperature, of the semiconductor device.

4. The driving method for a semiconductor device according to claim 1, wherein:

the arranging includes variably adjusting at least one of a start timing and a time length of the voltage rising period arranged in the turn-off operation according to an information quantity of an operating state of the semiconductor device.

5. The driving method for a semiconductor device according to claim 1, wherein:

the voltage drop period and the voltage rising period are divided into multiple periods to be arranged.

6. The driving method for a semiconductor device according to claim 1, further comprising:

detecting, in response to the turn-off command, an overcurrent state of the semiconductor device based on a current or a voltage under the ON-state of the semiconductor device before the turn-off command; and in the turn-off operation corresponding to the turn-off command, arranging the voltage rising period when the overcurrent state is detected, while not arranging the voltage rising period when the overcurrent state is not detected.

7. The driving method for a semiconductor device according to claim 1, wherein:

a common first voltage is applied to the gate in each of the voltage drop period and a discharging period of the gate in the turn-off operation, and a common second voltage is applied to the gate in each of the voltage rising period and a charging period of the gate in the turn-on operation.

8. The driving method according to claim 1, wherein:

the voltage drop period is defined by a start time and an end time that are determined by pre-stored time lengths measured from the start of the turn-on operation.

9. The driving method according to claim 1, wherein:

a time length of the voltage drop period is set such that the voltage of the gate does not drop to a Miller voltage or less during the voltage drop period in a normal turn-on operation.

10. The driving method according to claim 1, wherein:

the voltage rising period is defined by a start time and an end time that are determined by pre-stored time lengths measured from the start of the turn-off operation.

11. A driving device for a semiconductor device to be turned on and off according to a drive control signal, the driving device comprising:

a drive adjuster that generates a drive signal for controlling a turn-on operation of charging a gate of the semiconductor device under an OFF-state and a turn-off operation of discharging the gate of the semiconductor device under an ON-state in response to a turn-on command with a transition of the drive control signal from a first level to a second level and a turn-off command with a transition of the drive control signal from the second level to the first level; and a drive circuit that charges or discharges the gate according to the drive signal, wherein the drive adjuster generates the drive signal so as to arrange at least one of a voltage drop period that is provided within a period in which the drive control signal is maintained at the second level after start of the turn-on operation, and a voltage rising period that is provided within a period in which the drive control signal is maintained at the first level after start of the turn-off operation, the voltage drop period is created by a temporary discharge of the gate after end of a Miller period, and the voltage rising period is created by a temporary charge of the gate during a period in which a current of the semiconductor device is decreasing.

12. The driving device for a semiconductor device according to claim 11, further comprising:

an interface circuit to which a detection value of an information quantity of an operating state of the semiconductor device from a detector provided in the semiconductor device is input, wherein the drive adjuster variably adjusts at least one of a start timing and a time length of the voltage drop period arranged in the turn-on operation by using a value of the information quantity input to the interface circuit.

13. The driving device for a semiconductor device according to claim 12, wherein:

the information quantity of the operating state includes at least one of a voltage between main electrodes, a current between the main electrodes, a gate voltage, and a device temperature, of the semiconductor device.

14. The driving device for a semiconductor device according to claim 11, further comprising:

an interface circuit to which a detection value of an information quantity of an operating state of the semiconductor device by a detector provided in the semiconductor device is input, wherein the drive adjuster makes at least one of a start timing and a time length of the voltage rising period arranged in the turn-off operation variable by using a value of the information quantity input to the interface circuit.

15. The driving device for a semiconductor device according to claim 11, wherein:
the drive adjuster divides the voltage drop period and the voltage rising period into multiple periods to arrange the voltage drop period and the voltage rising period.

16. The driving device for a semiconductor device according to claim 11, wherein:
the drive adjuster detects, in response to the turn-off command, an overcurrent state of the semiconductor device based on a current or a voltage under the ON-state of the semiconductor device before the turn-off command, and, in the turn-off operation corresponding to the turn-off command, the drive adjuster arranges the voltage rising period when the overcurrent state is detected, while not arranging the voltage rising period when the overcurrent state is not detected.

17. The driving device for a semiconductor device according to claim 11, wherein;
the drive circuit electrically connects the gate to a first voltage terminal when the drive signal is at the first level, while electrically connecting the gate to a second voltage terminal when the drive signal is at the second level,
in a period during which the drive control signal is at the first level, the drive adjuster sets the drive signal to the second level in the voltage rising period while setting the drive signal to the first level in a period other than the voltage rising period, and in a period during which the drive control signal is at the second level, the drive adjuster sets the drive signal to the first level in the voltage drop period while setting the drive signal to the second level in a period other than the voltage drop period.

18. A power conversion apparatus comprising:
a main conversion circuit that is configured to include at least one semiconductor device, convert an input power, and output the converted power; and
a control circuit that outputs a control signal for controlling the main conversion circuit to the main conversion circuit,
wherein;
the control signal includes the drive control signal for each semiconductor device,
the main conversion circuit further includes the driving device according to claim 8 that is arranged in association with each semiconductor device, and
the driving device controls ON/OFF of each semiconductor device according to the drive control signal.

19. The driving device according to claim 11, wherein:
the drive adjuster comprises a delay circuit and an insertion pulse generator to define the voltage drop period based on one or more pre-stored time lengths.

20. The driving device according to claim 11, wherein:
the drive adjuster comprises a delay circuit and an insertion pulse generator to define the voltage rising period based on one or more pre-stored time lengths.

* * * * *